United States Patent [19]
Sentoku et al.

[11] Patent Number: 5,610,718
[45] Date of Patent: Mar. 11, 1997

[54] APPARATUS AND METHOD FOR DETECTING A RELATIVE DISPLACEMENT BETWEEN FIRST AND SECOND DIFFRACTION GRATINGS ARRANGED CLOSE TO EACH OTHER WHEREIN SAID GRATINGS HAVE DIFFERENT PITCH SIZES

[75] Inventors: Koichi Sentoku; Takahiro Matsumoto; Noriyuki Nose, all of Atsugi; Minoru Yoshii, Tokyo; Kenji Saitoh, Yokohama, all of Japan

[73] Assignee: Canon Kabushiki Kaisha, Tokyo, Japan

[21] Appl. No.: 297,511

[22] Filed: Aug. 29, 1994

Related U.S. Application Data

[63] Continuation of Ser. No. 947,928, Sep. 21, 1992, abandoned.

[30] Foreign Application Priority Data

Sep. 27, 1991 [JP] Japan .................................. 3-249204
Sep. 27, 1991 [JP] Japan .................................. 3-249216

[51] Int. Cl.$^6$ .................................................. G01B 9/02
[52] U.S. Cl. .......................... 356/363; 356/351; 356/349; 356/356
[58] Field of Search .................................. 356/349, 351, 356/355, 356, 363

[56] References Cited

U.S. PATENT DOCUMENTS

| 4,251,129 | 2/1981 | Suzki et al. . | |
| 4,577,968 | 3/1986 | Makosch . | |
| 4,596,467 | 6/1986 | Bartelt | 356/363 |
| 4,815,854 | 3/1989 | Tanaka et al. | 356/356 |
| 5,000,573 | 3/1991 | Suzuki et al. | 356/349 |
| 5,114,236 | 5/1992 | Matsugu et al. . | |
| 5,142,156 | 8/1992 | Ozawa et al. . | |
| 5,148,037 | 9/1992 | Suda et al. . | |
| 5,182,610 | 1/1993 | Shibata | 356/349 |
| 5,321,502 | 6/1994 | Matsumoto et al. | 356/349 |
| 5,448,357 | 9/1995 | Muraki | 356/349 |

FOREIGN PATENT DOCUMENTS

| 0309281 | 3/1989 | European Pat. Off. . |
| 0449582 | 10/1991 | European Pat. Off. . |
| 2843282 | 4/1979 | Germany . |

*Primary Examiner*—Georgia Y. Epps
*Assistant Examiner*—Robert Kim
*Attorney, Agent, or Firm*—Fitzpatrick, Cella, Harper & Scinto

[57] ABSTRACT

A method and device for measuring the relative displacement between first and second diffraction gratings includes an interference optical system forming first and second interference rays of light from light diffracted from the first and second diffraction gratings and separating the first and second interference rays of light on the basis of the difference in their direction of polarization, a first detector for detecting the first interference ray of light to generate a first detection signal, a second detector for detecting the second interference ray of light to generate a second detection signal, and signal processing section for detecting the phase difference between the first and second detection signals and for determining the relative displacement between the first and second diffraction gratings on the basis of the phase difference.

9 Claims, 16 Drawing Sheets

SUPERIMPOSED STATE

APPARATUS AND METHOD FOR DETECTING A RELATIVE DISPLACEMENT BETWEEN FIRST AND SECOND DIFFRACTION GRATINGS ARRANGED CLOSE TO EACH OTHER WHEREIN SAID GRATINGS HAVE DIFFERENT PITCH SIZES

This application is a continuation of application Ser. No. 07/947,928 filed Sep. 21, 1992 now abandoned.

BACKGROUND OF THE INVENTION

1. Field of the Invention

This invention relates to a measuring method and a measuring device which can be advantageously applied to a positioning device for positioning a mask relative to a wafer in an exposure apparatus for producing semiconductors or the like and to a superimposition accuracy measuring device.

2. Description of the Related Art

FIGS. 1 and 2 show a conventional positioning device, which is disclosed in Japanese Patent Application Laid-Open No. 64-8264. The device shown uses the optical heterodyne method, in which linear diffraction gratings are used as positioning marks. FIG. 3 illustrates the principle of this device. Referring to FIG. 1, a ray of light 202 emitted from a dual-channel linear-polarized laser beam source (Zeeman laser) 201 impinges upon a diffraction grating 203, and diffracted rays of light from this grating, i.e., a zero order diffracted ray of light 206, a +1st order diffracted ray of light 205 and a −1st order diffracted ray of light 207, are deflected by a mirror 204. After passing through an illumination optical system 208, one of the three diffracted rays of light is cut off. Then, the direction of polarization of one of the two remaining diffracted rays of light is changed by a half-wave plate, and applied, at an application angle as determined by the numerical aperture of the illumination system 208, to a diffraction grating 211 on a mask 212 and to a first diffraction grating 218 above a wafer 213. The travelling direction of a first diffracted ray of light 215, generated by reflection and diffraction at the first diffraction grating 218, is the same as the travelling direction of a second diffracted ray of light 216, generated by reflection and diffraction at the diffraction grating 211. However, as shown in FIG. 2, the position of the first diffraction grating 218 is offset in the y-direction with respect to the position of the diffraction grating 211, so that the first and second diffracted rays of light 215 and 216 do not coincide but instead are slightly separated from each other.

Numeral 220 indicates a first detector which is adapted to receive exclusively those components of the first diffracted ray of light 215 from the first diffraction grating 218 which have the same direction of polarization and are separated by a polarization beam splitter 223. The second diffracted ray of light 216 from the second diffraction grating 211 is intercepted by a knife edge 221 and does not impinge on the first detector 220. Numeral 224 indicates a second detector adapted to receive exclusively those components of the second diffracted ray of light 216 from the second diffraction grating 211 which have the same direction of polarization and are separated by a polarization beam splitter 223. The first diffracted ray of light 215 from the first diffraction grating 218 is intercepted by a knife edge 222 and does not impinge on the second detector 224. Numeral 225 indicates a phase difference meter for detecting the phases of optical beat signals which can be detected by the first and second detectors 220 and 224; numeral 226 denotes a wafer stage driving circuit for a wafer stage 214; and numeral 227 denotes a mask stage driving circuit for a mask stage 219.

Here, the principle of the positioning of the mask 212 relative to the wafer 213 will be illustrated with reference to FIGS. 3(a) and 3(b).

Referring to FIGS. 3(a) and 3(b), a synthesized light $E_M$ of the −1st order diffracted ray of a ray of light having a frequency of $f_1$ and the +1st order diffracted ray of a ray of light having a frequency of $f_2$ can be expressed by the following equation:

$$E_M = A_1 \exp\{i(2\pi f_1 t - \delta_M)\} + A_2 \exp\{i(2\pi f_2 t + \delta_M)\} \quad (1)$$

where $\delta_M = 2\pi \cdot \Delta X_M / P$ (P: the pitch of the grating) and $A_1$ and $A_2$ are constants determined experimentally. Symbol $\delta_M$ represents a variable generated by a displacement of the first grating 218 by an amount of $\Delta X_M$ in the x-direction with respect to a reference position.

The intensity $I_M$ of the synthesized light $E_M$ expressed by equation (1) can be expressed by the following equation:

$$I_M = |E_M|^2 = A^2_1 + A^2_2 + 2A_1 A_2 \cos\{2\pi(f_1 - f_2)t - 2\delta_M\} \quad (2)$$

The phase of the optical beat signal given by equation (2) varies by an amount corresponding to a change in the component which is expressed by the third term of equation (2) and which is generated during the displacement by $\Delta X_M$ of the first diffraction grating 218, that is, by $4\pi \Delta X_M / P$ (radian).

Since the value of P is known, it is possible to detect the displacement $\Delta X_M$ of the first diffraction grating 218 by detecting changes in the phase of the optical beat signal.

In completely the same manner as described above, it is also possible to detect the displacement $\Delta X_W$ of the second diffraction grating 211 on the wafer 213.

The optical beat signal $I_W$ detected by the second detector 224 represents the intensity of the synthesized light of the 1st order diffracted light having a frequency of $f_1$ and the −1st order diffracted light having a frequency of $f_2$, and can be expressed by the following equation:

$$I_W = A^2_1 + A^2_2 + 2A_1 A_2 \cos\{2\pi(f_1 - f_2)t - 2\delta_W\} \quad (3)$$

where $\delta_W = 2\pi \cdot \Delta X_W / P$.

The phase difference $\Delta \phi$ between the optical beat signal which is represented by equation (2) and which can be detected by the first detection means 220 and the optical beat signal which is represented by equation (3) and which can be detected by the second detection means 224, can be expressed by the following equation:

$$\Delta \phi = 4\pi (\Delta X_M - \Delta X_W)/P \quad (4)$$

In this way, the phase difference between the mask-diffracted-ray optical beat signal and the wafer-diffracted-ray optical beat signal is detected, and the mask stage and the wafer stage are moved relative to each other in such a way that the phase difference becomes 0°, thereby accurately positioning the mask relative to the wafer.

In actually measuring and evaluating the positioning performance of a device constructed as an exposure apparatus, a minute pattern formed on a mask has conventionally been superimposed on a wafer and transferred thereto by printing, and the displacement of the pattern on the wafer has been measured. For example, a vernier measurement method has been well known in the art, in which, as shown in FIG. 4(c), a so-called vernier pattern is formed on a wafer through exposure, and any displacement thereof is observed by magnifying it with a microscope or the like. The patterns in FIGS. 4(a) to 4(c) are all resist patterns exposed on wafers, the resist existing in the hatched sections. FIGS. 4(a)–4(c) show a means measuring displacement in the x-direction only. Here, patterns 251 and 252 form verniers with respect to each other, one division of which corresponds to 0.05 μm. First, exposure is effected through a first mask (reticle) onto a wafer to form (develop) the pattern 251, and then resist is applied thereto. Further, a second mask (reticle) having the pattern 252 is aligned with respect to the wafer and the exposure is effected, thereby forming the pattern 252 on the wafer. Then, it is checked to what degree of accuracy the first and second masks (reticles) are superimposed one upon the other after the alignment. The check is effected through measurement of the vernier pattern on the wafer, in which the patterns 251 and 252 are printed together as shown in FIG. 4(c), by magnifying the vernier pattern on the wafer by a microscope. For example, in the case of FIG. 4(a), the pattern 251 has a pitch of 7.95 μm and in FIG. 4(b) the pattern 252 has a pitch of 8.00 μm. The measurement and evaluation of superimposition for printing in conventional semiconductor exposure apparatuses have been conducted in the manner described above.

However, with the above second prior-art example, the measurement operation is difficult to automate and requires many hands. The first prior-art example allows automation of the measurement to be easily effected. On the other hand, it involves the following problems.

① Due to scattering and deterioration in the profile irregularity at the edge portions of the knife edges for splitting the two interference rays of light, noise is included in the beat signals.

② Any displacement of the set positions of the knife edges for splitting the two interference rays of light affect the measurement accuracy.

③ Since half the rays of light are cut off, a large loss in the quantity of light is involved.

SUMMARY OF THE INVENTION

It is the object of the present invention to overcome the deficiencies in the prior art.

It is another object of the present invention to provide a measuring method and device which automates the measurement of the relative displacement between diffraction gratings which are adjacent to each other.

It is still another object of the present invention to provide a method and device for detecting the relative displacement between diffraction gratings which facilitates the setting of an optical system for performing such a detection.

It is another object of the present invention to provide an apparatus and method for detecting the relative displacement between diffraction gratings which has improved measurement accuracy.

According to one aspect, the present invention which achieves at least one of these objects relates to a device for detecting the relative displacement between first and second diffraction gratings which are arranged to be close to each other, the device comprising an interference optical system, the interference optical system causing a ray of light having a first wavelength and a ray of light having a second wavelength different from the first wavelength to be diffracted by the first diffraction grating so as to generate two diffracted rays and causing the two diffracted rays to interfere with each other so as to form a first interference ray of light, the interference optical system causing a ray of light having a third wavelength and a ray of light having a fourth wavelength different from the third wavelength to be diffracted by the second diffraction grating so as to generate two diffracted rays and causing the two diffracted rays diffracted by the second diffraction grating to interfere with each other so as to form a second interference ray of light, the interference optical system separating the first and second interference rays of light from each other on the basis of the difference in their directions of polarization or the difference in the directions in which they travel from the corresponding diffraction gratings, a first detector for detecting the first interference ray of light to generate a first detection signal, a second detector for detecting the second interference ray of light to generate a second detection signal, and a signal processing section for detecting the phase difference between the first and second detection signals, and for determining the relative displacement between the first and second diffraction gratings on the basis of the phase difference.

In addition, the first and second diffraction gratings comprise groups of linear gratings each arranged at equal intervals, the pitch of the first diffraction grating being different from that of the second diffraction grating. The interference optical system causes the rays of light having the first and third wavelengths to impinge upon the first and second diffraction gratings, respectively, from a first direction and causes the rays of light having the second and fourth wavelengths to impinge upon the first and second diffraction gratings, respectively, from a second direction which is different from the first direction, thereby causing the first and second interference rays of light to travel in different directions from the first and second diffraction gratings, respectively.

The angles of incidence of the rays of light having the first, second, third, and fourth wavelengths, the pitches of the first and second diffraction gratings and the orders of diffraction of the diffracted rays that are to undergo interference are set in such a way that the phase difference between the first and second detection signals is proportional to the relative displacement of the first and second diffraction gratings.

The interference optical system causes the rays of light having the first and third wavelengths to impinge upon the first and second diffraction gratings, respectively, from directions different from each other and causes the rays of light having the second and fourth wavelengths to impinge upon the first and second diffraction gratings, respectively, from directions different from each other, thereby causing the first and second interference rays of light to travel in different directions from the first and second diffraction gratings, respectively.

The interference optical system comprises polarizing means for making the direction of polarization of the rays of light having the first and second wavelengths different from the direction of polarization of the rays of light having the third and fourth wavelengths, and a polarization beam splitter for separating the first and second interference rays of light from each other.

In accordance with another aspect, the present invention which achieves at least one of these objects relates to a method of detecting the relative displacement between first and second diffraction gratings which are arranged to be close to each other, the method comprising, an interference step comprising the steps of diffracting a ray of light having a first wavelength and a ray of light having a second wavelength different from the first wavelength by the first diffraction grating so as to generate to diffracted rays, causing the two diffracted rays to interfere with each other so as to form a first interference ray of light, diffracting a ray of light having a third wavelength and a ray of light having a fourth wavelength different form the third wavelength by the second diffraction grating so as to generate two diffracted rays, and causing the two diffracted rays diffracted by the second diffraction grating to interfere with each other so as to form a second interference ray of light, a separation step in which the first and second interference rays of light are separated from each other by the difference in their directions of polarization or by the difference in the directions in which they travel from the first and second diffraction gratings, a light detection step comprising the steps of detecting the first interference ray of light and generating a first detection signal in response to the detecting step, and detecting the second interference ray of light and generating a second detection signal in response to detecting the second interference ray of light, and a phase difference detection step comprising the steps of detecting the phase difference between the first and second detection signals and determining the relative displacement between the first and second diffraction gratings on the basis of the detected difference.

The method further comprises the step of forming the first and second diffraction gratings of groups of linear gratings arranged at equal intervals, the pitch of the first diffraction grating being different from that of the second diffraction grating. In addition, the separation step comprises the steps of causing the rays of light having the first and third wavelength to impinge upon the first and second diffraction gratings, respectively, from a first direction and causing the rays of light having the second and fourth wavelengths to impinge upon the first and second diffraction gratings, respectively, from a second direction which is different from the first direction, thereby causing the first and second interference rays of light to travel in different directions from the first and second diffraction gratings, respectively.

The method further comprises the step of setting the angles of incidence of the rays of light having the first, the second, the third, and the fourth wavelengths, the pitches of the first and second diffraction gratings and the orders of diffraction of the diffracted rays that are to undergo interference in such a way that the phase difference between the first and second detection signals is proportional to the relative displacement between the first and second diffraction gratings.

The separation step comprises the steps of causing the rays of light having the first and third wavelengths to impinge upon the first and second diffraction gratings, respectively, from directions different from each other, and causing the rays of light having the second and fourth wavelengths to impinge upon the first and second diffraction gratings, respectively, from directions different from each other, thereby causing the first and second interference rays of light to travel in different directions from the first and second diffraction gratings, respectively.

The separation step also comprises the steps of using polarizing means for making the direction of polarization of the rays of light having the first and second wavelengths different from the direction of polarization of the rays of light having the third and fourth wavelengths, and using a polarization beam splitter for separating the first and second interference rays of light from each other.

Other objects, advantages, and features of the present invention will become apparent from the following detailed description of preferred embodiments when read in conjunction with the attached drawings.

DESCRIPTION OF THE PREFERRED EMBODIMENTS

Figure 1:
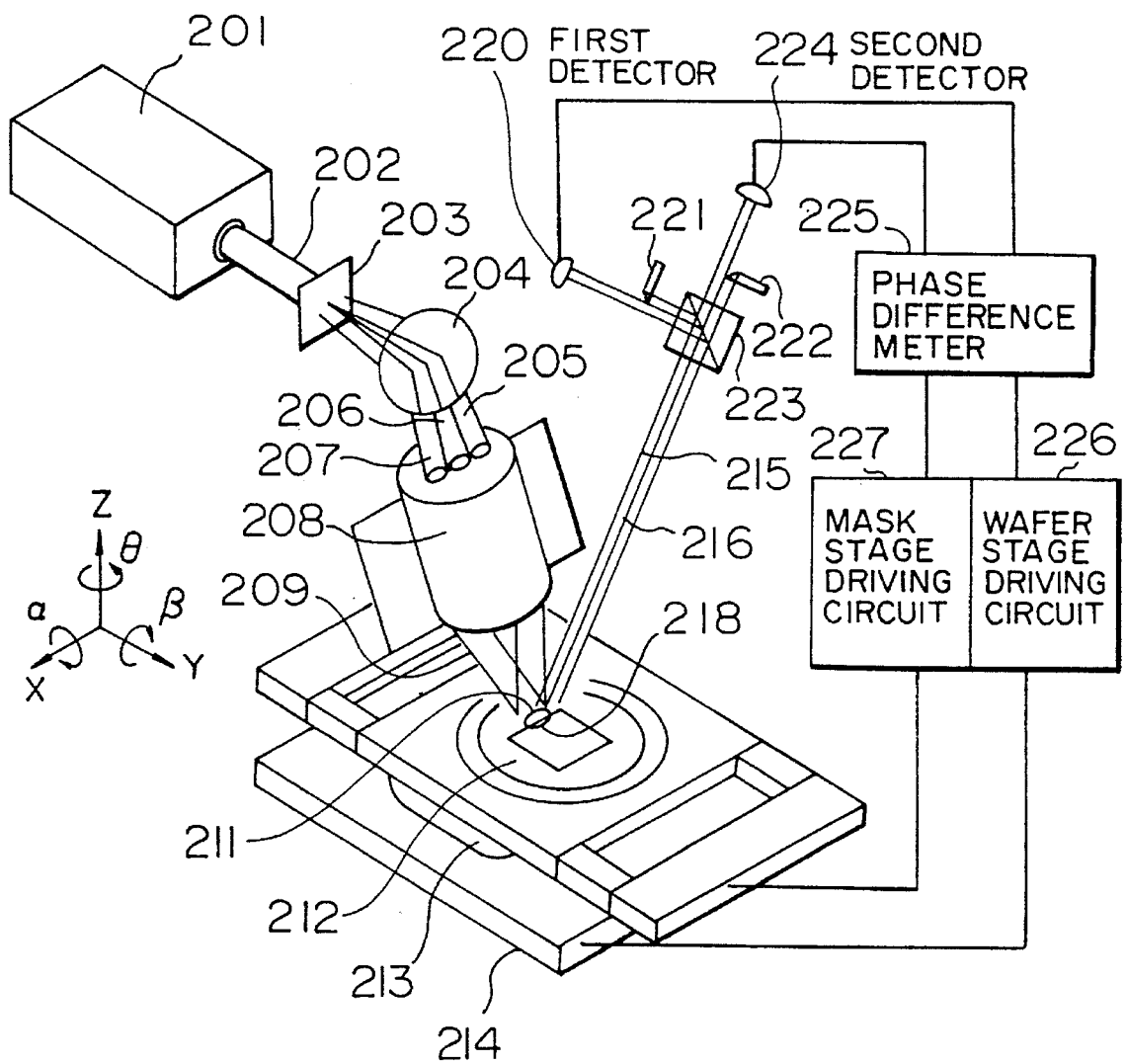
FIG. 1 is a schematic diagram showing a conventional positioning device.
Figure 2:
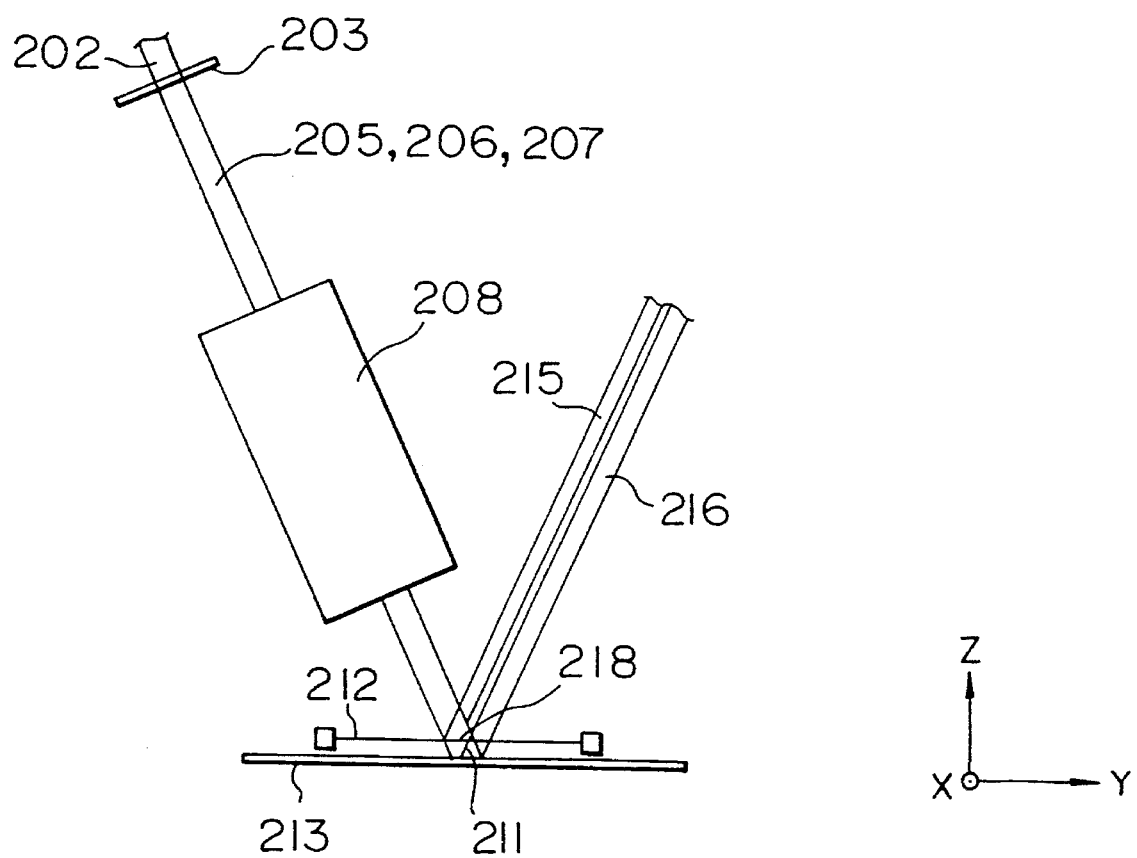
FIG. 2 is a schematic diagram showing the conventional positioning device.
Figure 3A:
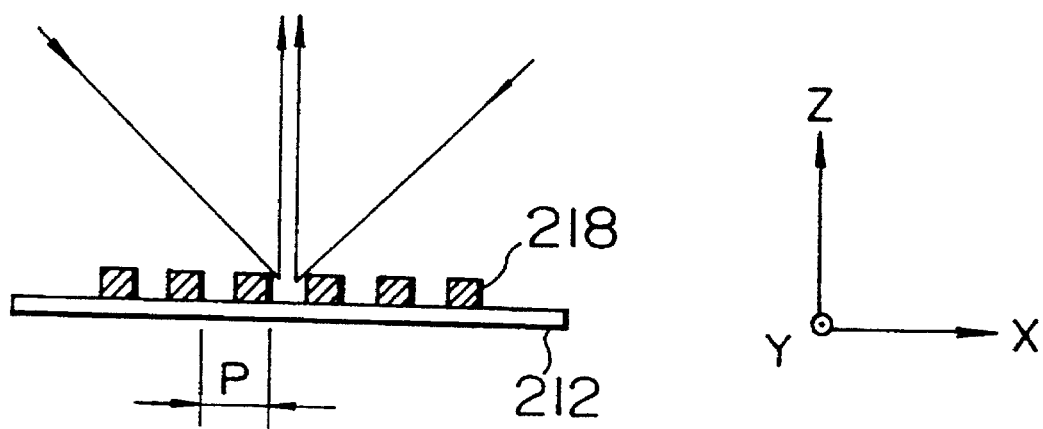
FIGS. 3(a) and 3(b) are schematic diagrams illustrating the positioning principle of the conventional positioning device.
Figure 3B:
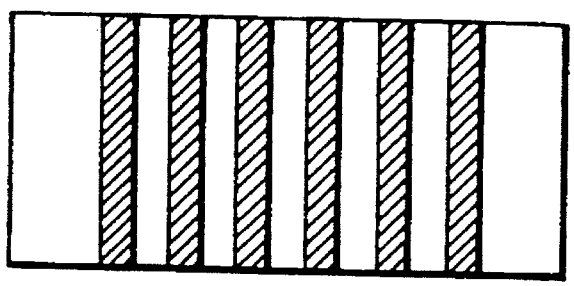
Figure 3B:
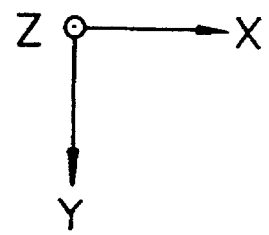
Figure 4A:
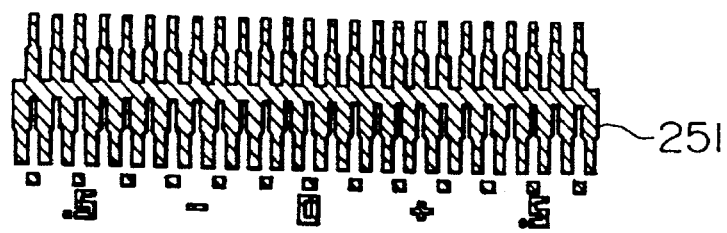
FIGS. 4(a) through 4(c) illustrate a conventional method of measuring superimposition accuracy.
Figure 4B:
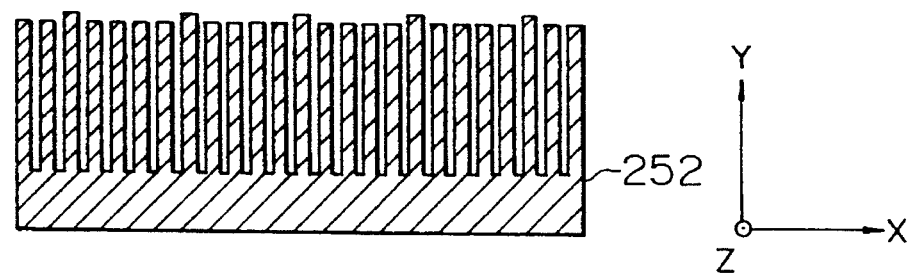
Figure 4C:
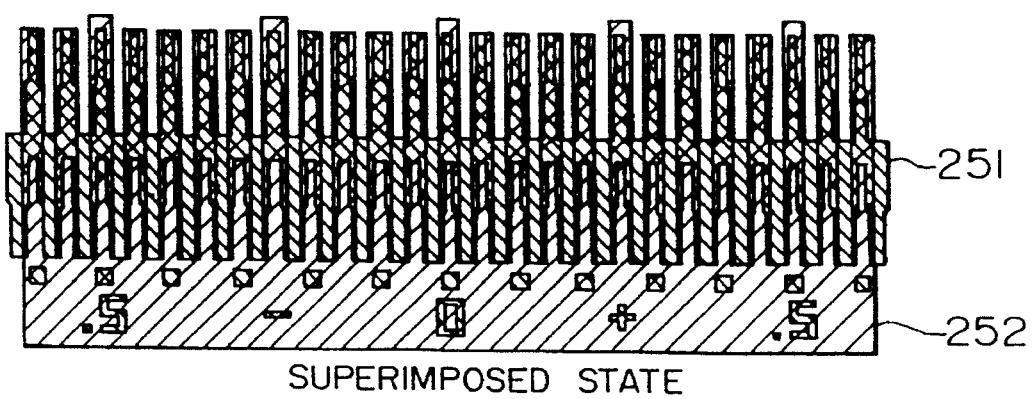

A measuring method according to an embodiment described below comprises the steps of: forming a first interference ray of light by causing diffracted rays of light to interfere with each other, the diffracted rays of light being generated by causing a ray of light having a first wavelength and a ray of light having a second wavelength which is different from the first wavelength to impinge upon a first diffraction grating; forming a second interference ray of light by causing diffracted rays of light to interfere with each other, the diffracted rays of light being generated by causing a ray of light having a third wavelength and a ray of light having a fourth wavelength which is different from the third wavelength to impinge upon a second diffraction grating; separating the first interference ray of light traveling out from the first diffraction grating and the second interference ray of light traveling out from the second diffraction grating from each other by a difference in the angles at which the diffracted rays travel out from the diffraction gratings or by a difference in the directions of polarization of these diffracted rays of light; and comparing the phases of beat signals of the first and second interference rays of light separated from each other so as to detect a positional relationship between the first and second diffraction gratings. A measuring device according to an embodiment described below comprises: first illumination means for causing diffracted rays of light to interfere with each other, the diffracted rays of light being generated by causing a ray of light having a first direction of polarization and a first wavelength and a ray of light having the first direction of polarization and a second wavelength which is different from the first wavelength to impinge upon a first diffraction grating; second illumination means for causing diffracted rays of light to interfere with each other, the diffracted rays of light being generated by causing a ray of light having a second direction of polarization which is different from the first direction of polarization and a third wavelength and a ray of light having the second direction of polarization and a fourth wavelength which is different from the third wavelength to impinge upon a second diffraction grating; separation means for separating first and second interference rays of light traveling out from the first and second diffraction gratings from each other by a difference their directions of polarization; and detection means for detecting the positional relationship between the first and second diffraction gratings by comparing the phases of beat signals of the first and second interference rays of light separated from each other by the separation means. Further, a measuring device according to an embodiment described below comprises: first illumination means for causing a first interference ray of light to travel in a first direction, the first interference ray of light being generated by causing a ray of light having a first wavelength and a ray of light having a second wavelength which is different from the first wavelength to impinge upon a first diffraction grating; second illumination means for causing a second interference ray of light to travel in a second direction which is different from the first direction, the second interference ray of light being generated by causing a ray of light having a third wavelength and a ray of light having a fourth wavelength which is different from the third wavelength to impinge upon a second diffraction grating; and detection means for detecting the positional relationship between the first and second diffraction gratings by comparing the phases of beat signals of the first and second interference rays of light with each other.

The present invention will now be described with reference to the accompanying drawings.

First, the principle of the first embodiment of the present invention will be explained with reference to Fig. 5.

Figure 5:
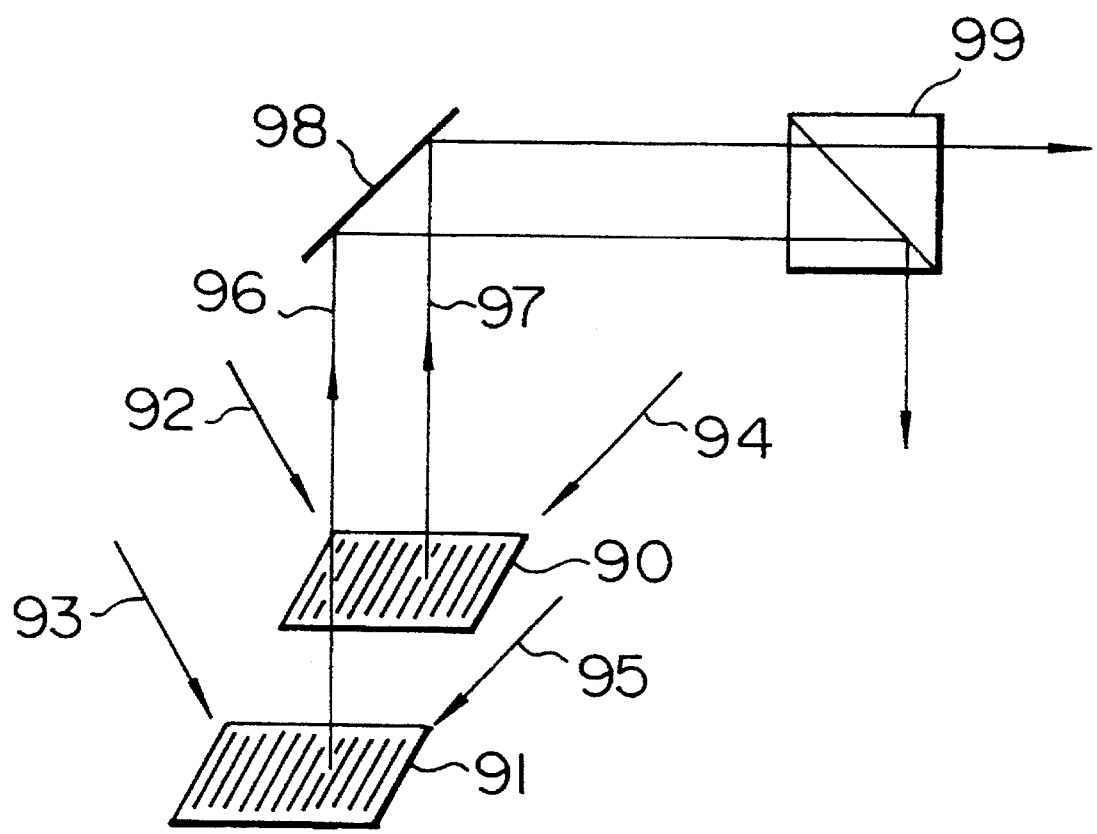
FIG. 5 is a schematic diagram illustrating the principle of a first embodiment of the present invention.

Referring to FIG. 5, two linear gratings 90 and 91 are arranged adjacent to each other. Rays of light 92 and 94 are applied to the linear grating 90, and rays of light 93 and 95 are applied to the linear grating 91 (The rays of light 92 and 94 are S waves, and the rays of light 93 and 95 are P waves). The intensities of these four rays of light 92 to 95, i.e., $I_{92}$, $I_{93}$, $I_{94}$ and $I_{95}$, can be mathematically expressed as follows:

$$I_{92} = \exp(i\omega_1 t) \quad (5)$$

$$I_{93} = \exp(i\omega_1 t) \quad (6)$$

$$I_{94} = \exp(i\omega_2 t) \quad (7)$$

$$I_{95} = \exp(i\omega_2 t) \quad (8)$$

In the above equations, $\omega_1$ and $\omega_2$ represent angular frequencies. The −1st order diffracted ray of the ray of light 92 with respect to the linear grating 90 and the +1st order diffracted ray of the ray of light 94 with respect to the linear grating 90 are superimposed one upon the other by the linear grating 90 to form an interference ray of light 97. Likewise, the −1st order diffracted ray of the ray of light 93 with respect to the linear grating 91 and the +1st order diffracted ray of the ray of light 95 with respect to the linear grating 91 are superimposed one upon the other by the linear grating 91 to form an interference ray of light 96. Since the interference ray of light 97 synthesized out of the rays of light 92 and 94 is a P wave, and the interference ray of light 96 synthesized out of the rays of light 93 and 95 is a S wave, it is easy for the two interference rays of light to be spatially separated from each other by a PBS (polarization beam splitter) 99 after their direction is changed by a mirror 98.

Figure 6:
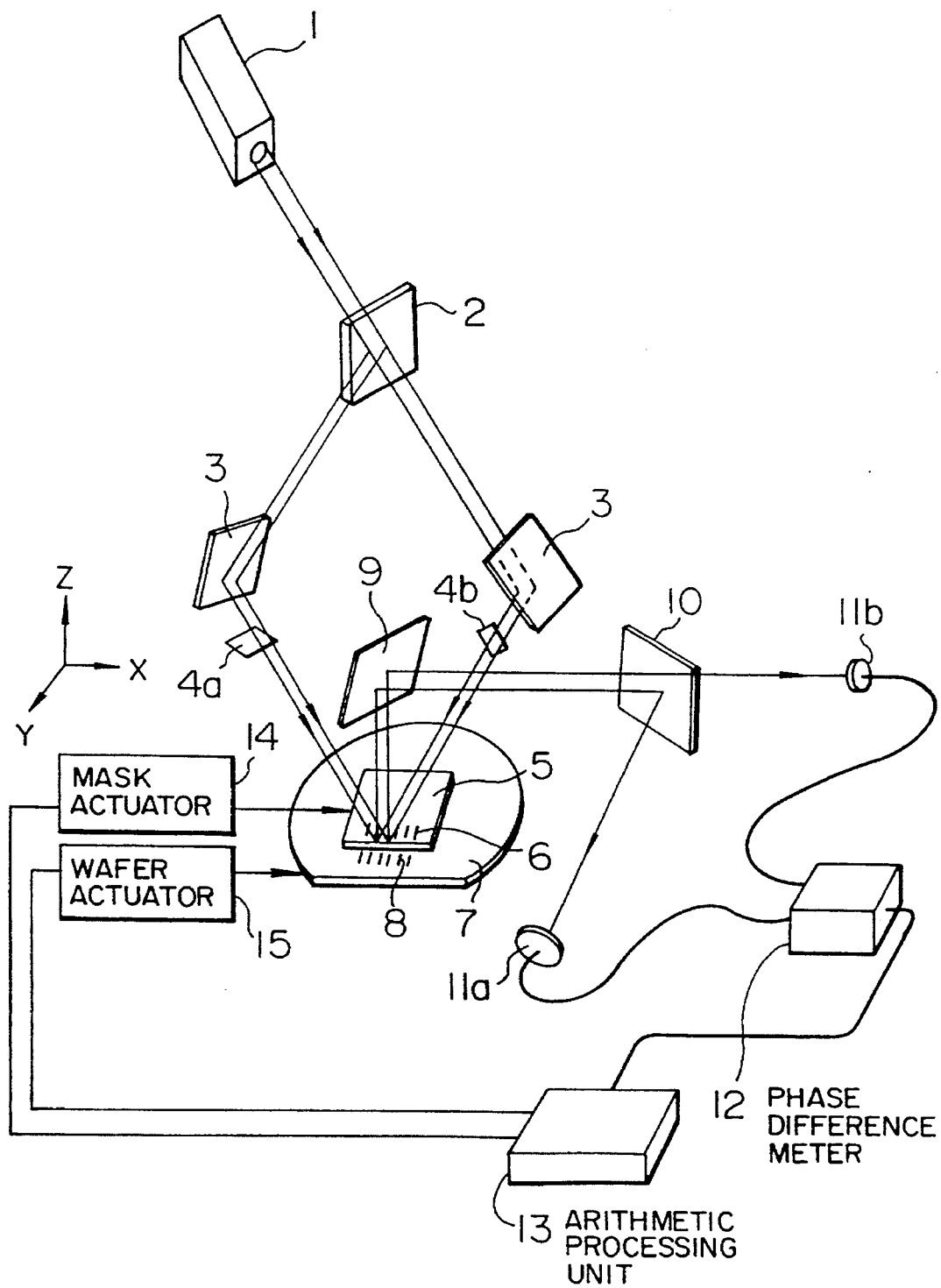
FIG. 6 is a schematic diagram showing a positioning device according to the first embodiment of the present invention.
Figure 7:
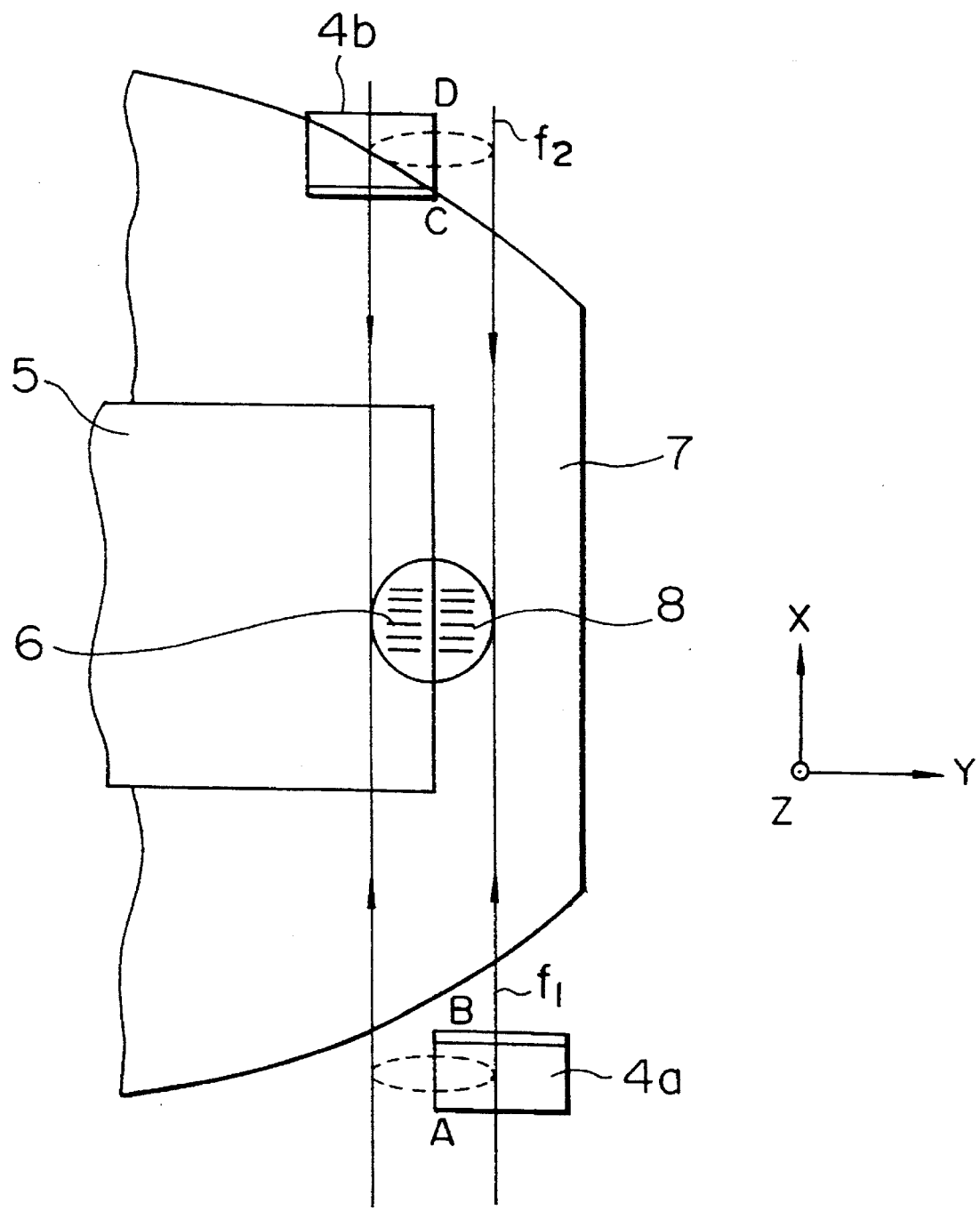
FIG. 7 is a diagram showing the relationship between the incident rays of light and $\lambda/2$ plates of FIG. 6.

FIGS. 6 and 7 show a device according to the first embodiment of the present invention. FIG. 6 is a schematic diagram showing the construction of the positioning section of a proximity-exposure-type semiconductor producing apparatus, which uses far-ultraviolet rays, X-rays or the like. FIG. 7 is a top view of that portion of this positioning section which is around the diffraction gratings. Referring to FIG. 6, numeral 1 indicates a Zeeman laser for emitting rays of light which are polarized in such a way that their planes of polarization are normal to each other and which have slightly different frequencies (a frequency of $f_1$ for the S polarization and a frequency of $f_2$ for the P polarization); numeral 2 denotes a PBS (a polarization beam splitter); numeral 3 denotes mirrors; numerals 4a and 4b denote $\lambda/2$ plates; numeral 5 denotes a mask; numeral 6 denotes a diffraction grating on the mask 5; numeral 7 denotes a wafer; numeral 8 denotes a diffraction grating on the wafer 7; numeral 9 denotes a mirror; numeral 10 denotes a PBS, numerals 11a and 11b denote photo sensors; numeral 12 denotes a phase difference meter; numeral 13 denotes an arithmetic processing unit; numeral 14 denotes a mask actuator for driving the mask in the x-direction; and numeral 15 denotes a wafer actuator for driving the wafer in the x-direction.

Rays of light emitted from the Zeeman laser 1 are divided into two paths by the polarization beam splitter 2 due to a difference in their planes of polarization. The ray of light reflected by the polarization beam splitter 2 (the S polarized light), which has a frequency of $f_1$, and the ray of light transmitted through the polarization beam splitter 2 (the P polarized light), which has a frequency of $f_2$, are deflected by the mirrors 3 and impinge upon the diffraction grating 6 on the mask 5 and the diffraction grating 8 on the wafer 7 at predetermined angles of incidence.

As shown in FIG. 7, the mirrors 3 and the $\lambda/2$ plates 4a and 4b are set in such a way that the respective central portions of the rays of light pass through the center between the diffraction gratings 6 and 8 and one end AB of the $\lambda/2$ plate 4a and one end CD of the λ/2 plate 4b are in alignment with the central portions of these rays of light. Due to this arrangement, the plane of polarization of that portion of the ray of light S-polarized and having a frequency of $f_1$ which has been transmitted through the section where the λ/2 plate 4a exists is turned by 90° to become a P-polarized ray of light, which impinges upon the diffraction grating 8 on the wafer 7, and that portion of the above ray of light, S-polarized and having a frequency of $f_1$, which has passed through the section where there is no λ/2 plate 4a remains S-polarized to impinge upon the diffraction grating 6 on the mask 5. On the other hand, the plane of polarization of that portion of the ray of light P-polarized and having a frequency of $f_2$ which has been transmitted through the section where the λ/2 plate 4b exists is turned 90° to become an S-polarized ray of light, which impinges upon the diffraction grating 6, and that portion of the above ray of light, S-polarized and having a frequency of $f_2$, which has passed through the section where there is no λ/2 plate 4a remains P-polarized to impinge upon the diffraction grating 8. Thus, the diffracted rays of light from the diffraction grating 6 are S-polarized rays of light, and the diffracted rays of light from the diffraction grating 8 are P-polarized rays of light. The diffracted rays of the rays of light incident from above the diffraction gratings (as seen in FIG. 7) and the diffracted rays of the opposite sign of the rays of light incident from below the diffraction gratings go out in the same direction. That is, by setting the mirrors 3 in such a way that the ±n-order diffracted rays of light are generated in the same direction, it is possible to obtain S-polarized interference rays of light from the diffraction grating 6 and P-polarized interference rays of light from the diffraction grating 8. Since they are synthesized rays of light each consisting of rays of light having slightly different frequencies of $f_1$ and $f_2$ which are superimposed one upon the other, these interference rays of light provide optical beat signals having a beat frequency of $f_1-f_2$.

In the case of FIG. 6, the −1st order diffracted ray of light $E_M(-1)$, whose frequency is $f_1$, and the +1st order diffracted ray of light $E_M(1)$, whose frequency is $f_2$, traveling from the diffraction grating 6, can be expressed as follows in terms of complex amplitudes:

$$E_M(-1)=A_M \cdot \exp\{i(\omega_1 t+\phi_1-\phi_M)\} \quad (9)$$

$$E_M(1)=B_M \cdot \exp\{i(\omega_2 t+\phi_2+\phi_M)\} \quad (10)$$

In the above equations, $A_M$ and $B_M$ represent amplitudes; $\omega_1$ and $\omega_2$ represent angular frequencies, which are $2\pi f_1$ and $2\pi f_2$, respectively; $\phi_1$ and $\phi_2$ represent the initial phases of the rays of light; and $\phi_M$ represents a change in phase resulting from a displacement $\Delta X_M$ of the mask 5 from a reference position in the x-direction; and assuming that the pitch of the diffraction grating 6 is P, $\phi_M=2\pi\Delta X_M/P$.

The −1st order diffracted ray of light $E_W(-1)$, whose frequency is $f_1$, and the +1st order diffracted ray of light $E_W(1)$, whose frequency is $f_2$, traveling out from the diffraction grating 8, can be expressed as follows in terms of complex amplitudes:

$$E_W(-1)=A_W \cdot \exp\{i(\omega_1 t+\phi_1-\phi_W)\} \quad (11)$$

$$E_W(1)=B_W \cdot \exp\{i(\omega_2 t+\phi_2+\phi_W)\} \quad (12)$$

In the above equations, $A_W$ and $B_W$ represent amplitudes; and $\phi_W$ represents a change in phase resulting from a displacement $\Delta X_W$ of the wafer 7 from a reference position in the x-direction; and assuming that the pitch of the diffraction grating 8 is P, $\phi_W=2\pi\Delta X_W/P$.

A change in the intensity of light, $I_M$, when the two rays of light expressed by equations (9) and (10) are superimposed one upon the other, can be expressed as follows:

$$I_M=A^2_M+B^2_M+2A_M \cdot B_M \cdot \cos\{(\omega_2-\omega_1)t+(\omega_2-\phi_1)+2\phi_M)\} \quad (13)$$

A change in the intensity of light, $I_W$, when the two rays of light expressed by equations (11) and (12) are superimposed one upon the other can be expressed as follows:

$$I_W=A^2_W+B^2_W+2A_W \cdot B_W \cdot \cos\{(\omega_2-\omega_1)t+(\omega_2-\omega_1)+2\omega_W\} \quad (14)$$

Separation of the two diffracted-ray interference rays of light expressed by equations (13) and (14) can be easily effected by a polarization beam splitter 10. The diffracted-ray interference ray of light (S-polarized) traveling out from the diffraction grating 6 is reflected by the polarization beam splitter 10 and photoelectrically detected by the photo sensor 11a. The diffracted-ray interference ray of light (P-polarized) traveling out from the diffraction grating 8 is transmitted through the polarization beam splitter 10 and photoelectrically detected by the photo sensor 11b. The two beat signals, photoelectrically detected, are introduced into the phase difference meter 12 so as to measure the phase difference $\Delta\omega$ therebetween, which can be expressed as:

$$\Delta\omega=\omega_M-\omega_W=4\pi(X_M-X_W)/P \quad (15)$$

Thus, on the basis of the $\Delta\omega$ measured by the phase difference meter 12, the arithmetic processing unit 13 performs the following calculation:

$$X_M-X_W=P \cdot \Delta\phi/4\pi \quad (16)$$

In this way, any displacement of the mask with respect to the wafer, $X_M-X_W$, is detected and, on the basis of the value of this displacement, a drive command signal is supplied to at least one of the two well-known actuators, i.e., the mask actuator 14 for driving the mask in the x-direction and the wafer actuator 15 for driving the wafer in the x-direction, thereby positioning the mask relative to the wafer.

Further, it is also possible, though omitted in the above description, to provide a similar system for positioning in the y-direction to perform a similar positioning in the y-direction, too. Moreover, though in the above description ±1st order diffracted rays of light were used, the invention is not limited to the use of these rays of light. The measurement is also possible with other orders of diffraction. Assuming that an m-order diffracted ray of light which is diffracted perpendicularly to the mask and wafer is used, the mirrors 3 are set in such a way that the angle of incidence (radian) is one which can be calculated from the following equation:

$$\theta=\sin^{-1}(m\lambda/P) \quad (17)$$

where P is the pitch of the diffraction gratings on the mask and wafer and X is the wavelength of the incident light.

Figure 8:
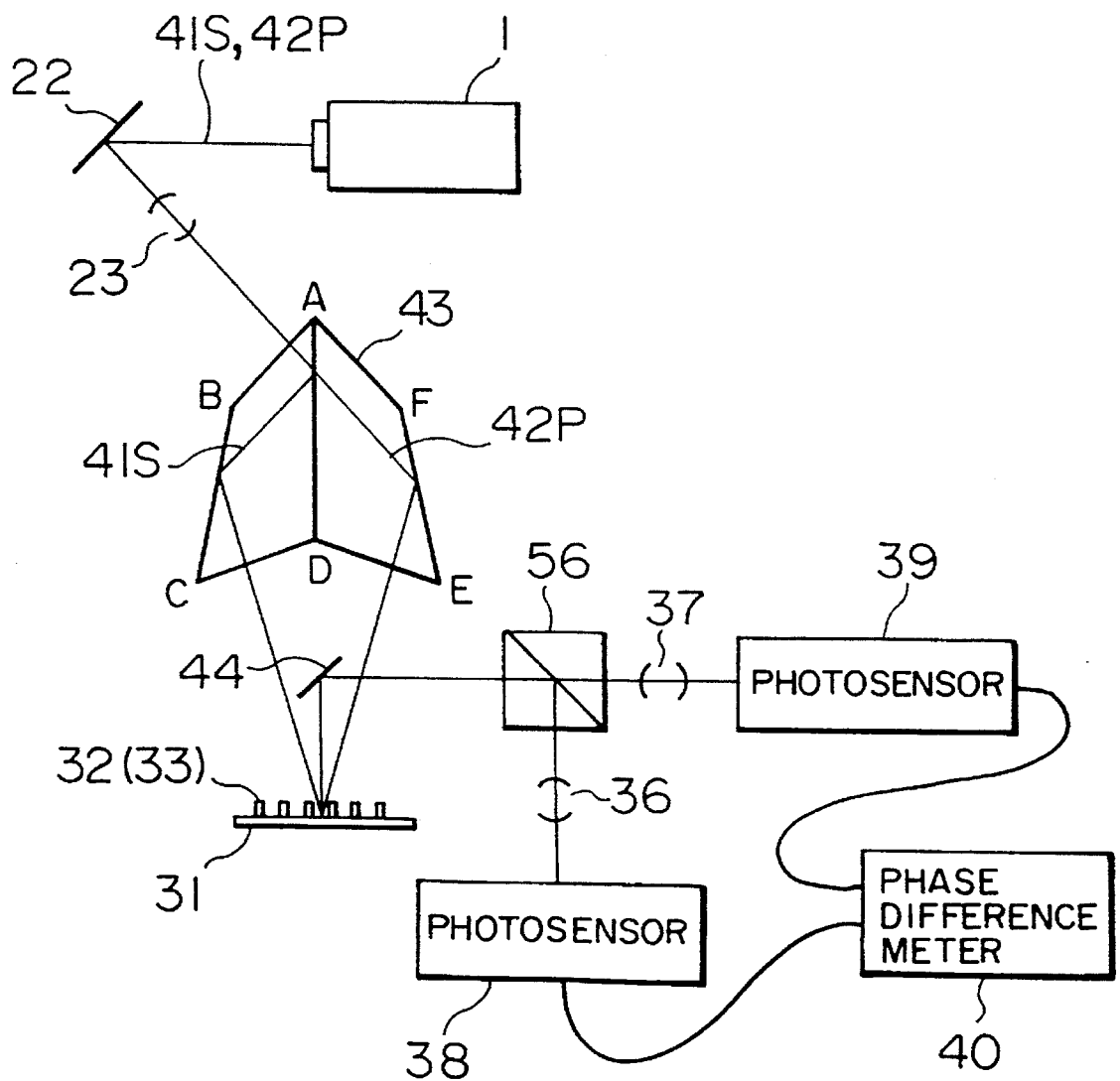
FIG. 8 is a schematic diagram of a superimposition accuracy measuring device according to a second embodiment of the present invention.

FIG. 8 shows a second embodiment of the present invention. In this embodiment, a diffraction grating on a mask is printed onto a wafer to prepare a diffraction grating 32, and at least either a mask stage or a wafer stage is moved by a predetermined amount so as to print a diffraction grating 33. Or, the mask is changed, and the diffraction grating 33 is printed at a position adjacent to the diffraction grating 32, thereby preparing two diffraction gratings on the wafer for the purpose of superimposition evaluation. Emitted from the Zeeman laser 1 are two rays of light 41S and 42P whose planes of polarization are normal to each other and whose frequencies are slightly different from each other ("S" and "P" in the above reference numerals respectively indicate an S wave and a P wave). The intensities of these rays of light, i.e., I(41S) and I(42P), can be mathematically expressed as follows:

$$I(41S) = \exp(i\omega_1 t) \quad (18)$$

$$I(42P) = \exp(i\omega_2 t) \quad (19)$$

where $\omega_1$ and $\omega_2$ represent angular frequencies.

Figure 9:
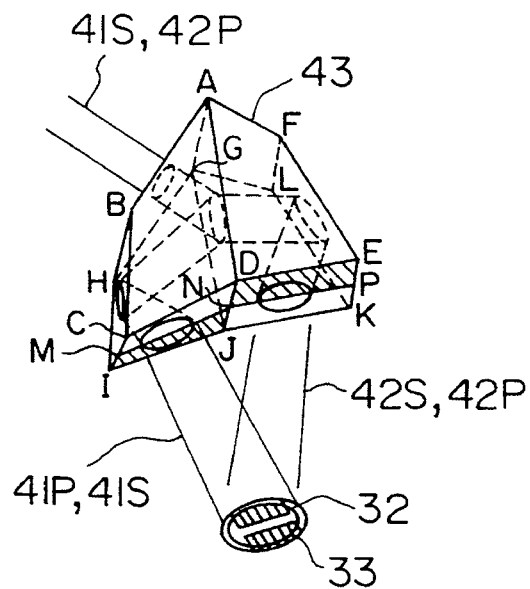
FIG. 9 is a diagram showing the structure of an arrow-shaped prism and the optical paths therein.
Figure 10:
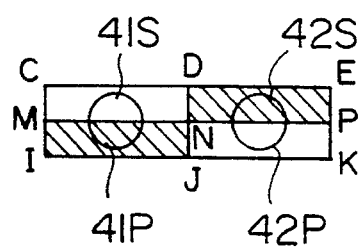
FIG. 10 is a diagram illustrating the exit surface of the arrow-shaped prism.

The direction of the two rays of light 41S and 42P is changed by a mirror 22, and these rays of light are transmitted through a collimator lens 23 to impinge upon an arrow-shaped prism (hereinafter referred to as the "arrow prism") 43, which comprises a polarization beam splitter plane (AD plane) and mirrors (BC and EF planes) integral therewith. FIG. 9 shows optical paths in the arrow prism 43. The two rays of light incident upon the arrow-shaped prism 43 are separated into two paths by the ADJG plane (the polarization beam splitter plane) due to the difference in their planes of polarization. The ray of light 41S is reflected by the ADJG plane and is further reflected by the BCIH plane to change its direction so as to be applied to two adjacent linear gratings 32 and 33. The ray of light 42P is transmitted through the ADJG plane and reflected by the EFLK plane to change its direction so as to be applied to the two adjacent linear gratings 32 and 33. Here, λ/2 plates are glued to the areas MIJN and NJKP of the exit surface of the arrow-shaped prism. FIG. 10 is an enlarged view of the exit surface of this arrow-shaped prism. That portion of the ray of light 415 which is transmitted through the CMND area is an S-polarized ray of light, as in the prior art, whereas, the plane of polarization of that portion of the ray of light 41S which is transmitted through the MIJN area is turned by a 90° to become a P-polarized ray of light 41P. Likewise, that portion of the ray of light 42P which is transmitted through the area DNPE undergoes a similar turning of its plane of polarization to become an S-polarized ray of light 42S.

Figure 11:
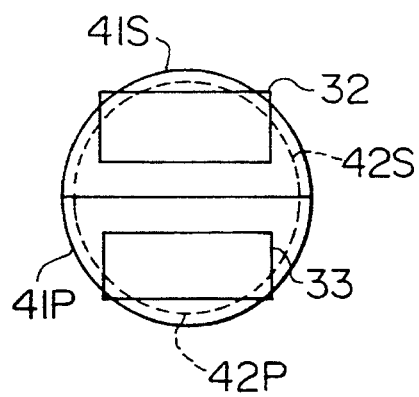
FIG. 11 is a diagram illustrating a relationship between two adjacent diffraction gratings and rays of light applied thereto.

FIG. 11 is a top view of the diffraction grating section of this embodiment. After leaving the arrow-shaped prism 43, the four rays of light, which differ from each other in terms of a combination of their planes of polarization and their frequencies, are applied to two adjacent diffraction gratings 32 and 33 as shown in FIG. 11 and are diffracted. The rays of light 41S and 42S are diffracted by the diffraction grating 32 to become a −1st order diffracted ray of light 41−1S and a +1st order diffracted ray of light 42+1S, respectively. Likewise, the rays of light 41P and 42P are diffracted by the diffraction grating 33 to become a −1st order diffracted ray of light 41−1P and a +1st order diffracted ray of light 42+1P, respectively. The respective intensities of these four diffracted rays of light, i.e., I(41−1S), I(42+1S), I(41−1P) and I(42+1P), can be mathematically expressed as follows:

$$I(41-1S) = A \cdot \exp\{i(\omega_1 t - \phi_a)\} \quad (20)$$

$$I(41+1S) = B \cdot \exp\{i(\omega_2 t - \phi_a)\} \quad (21)$$

$$I(41-1P) = C \cdot \exp\{i(\omega_1 t - \phi_b)\} \quad (22)$$

$$I(41+1P) = D \cdot \exp\{i(\omega_2 t - \omega_b)\} \quad (23)$$

where A, B, C and D represent amplitudes, ω1 and ω2 represent angular frequencies, and $\phi_a$ and $\phi_b$ represent displacement of the diffraction gratings 32 and 33 from certain reference positions.

Referring to FIG. 8, of the four diffracted rays, those which are diffracted by the same diffraction grating are caused to interfere with each other, and the resulting interference ray of light is separated into two rays by a PBS 56 due to the difference in their planes of polarization. The two interference rays of light thus obtained are condensed upon photo sensors 38 and 39 by means of lenses 36 and 37, respectively to effect photoelectric conversion, thereby obtaining beat signals $U_a$ and $U_b$ containing phase amounts corresponding to displacements of the diffraction gratings from certain reference positions.

$$U_a = A^2 + B^2 + 2AB \cdot \cos\{(\omega_2 - \omega_1)t + 2\phi_a\} \quad (24)$$

$$U_b = C^2 + D^2 + 2CD \cdot \cos\{(\omega_2 - \omega_1)t + 2\phi_b\} \quad (25)$$

By supplying the two beat signals expressed by equations (24) and (25) to a phase difference meter 40, which consists of a lock-in amplifier or the like, the phase difference between the two beat signals:

$$\Delta\phi = 2(\phi_b - \phi_a) \quad (26)$$

is obtained, from which the relative displacement of the two diffraction gratings can be obtained by using, for example, equation (16).

With the alignment device free from error, the second diffraction grating is formed on the wafer through this alignment process, and the two diffraction gratings 32 and 33 on the wafer are designed in such a way that they are not offset in the x-direction. Then, the relative displacement at this time is the alignment error.

The principle of the third embodiment of the present invention will now be described with reference to FIG. 12.

Figure 12:
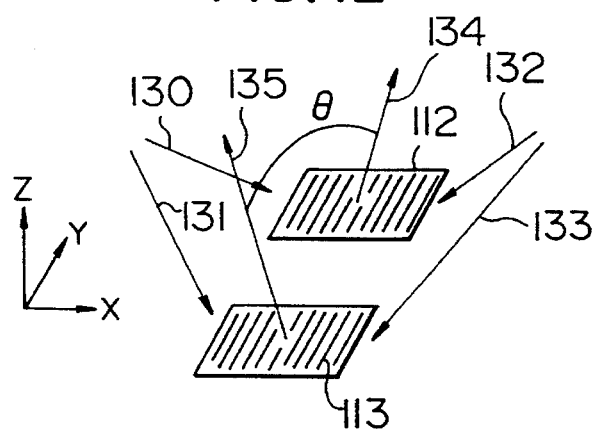
FIG. 12 is a diagram illustrating the principle of a third embodiment of the present invention.

Referring to FIG. 12, two diffraction gratings 112 and 113 are arranged adjacent to each other. Rays of light 130 and 132 are applied to the diffraction grating 112, and rays of light 131 and 133 are applied to the diffraction grating 113 (The rays of light 130 and 132 are S waves, and the rays of light 131 and 133 are P waves). The intensities of these four rays of light, i.e., $I_{130}$, $I_{131}$, $I_{132}$ and $I_{133}$, can be mathematically expressed as follows:

$$I_{130} = \exp\{i(\omega_1 t)\} \quad (27)$$

$$I_{131} = \exp\{i(\omega_1 t)\} \quad (28)$$

$$I_{132} = \exp\{i(\omega_2 t)\} \quad (29)$$

$$I_{133} = \exp\{i(\omega_2 t)\} \quad (30)$$

In the above expressions, $\omega_1$ and $\omega_2$ are angular frequencies. The −1st order diffracted ray of the ray of light 130 with respect to the diffraction grating 112 and the +1st order diffracted ray of the ray of light 132 with respect to the diffraction grating 112 are superimposed one upon the other to form an interference ray of light 134. Likewise, the −1st order diffracted ray of the ray of light 131 with respect to the diffraction grating 113 and the +1st order diffracted ray of the ray of light 133 with respect to the diffraction grating 113 are superimposed one upon the other to form an interference ray of light 135. The angles of incidence of the incident rays of light are set beforehand in such a way that the interference rays of light 134 and 135 diverge at an angle θ with respect to each other, after leaving the diffraction gratings. Accordingly, it is easy to spatially separate the two interference rays of light 134 and 135 from each other.

Figure 13:
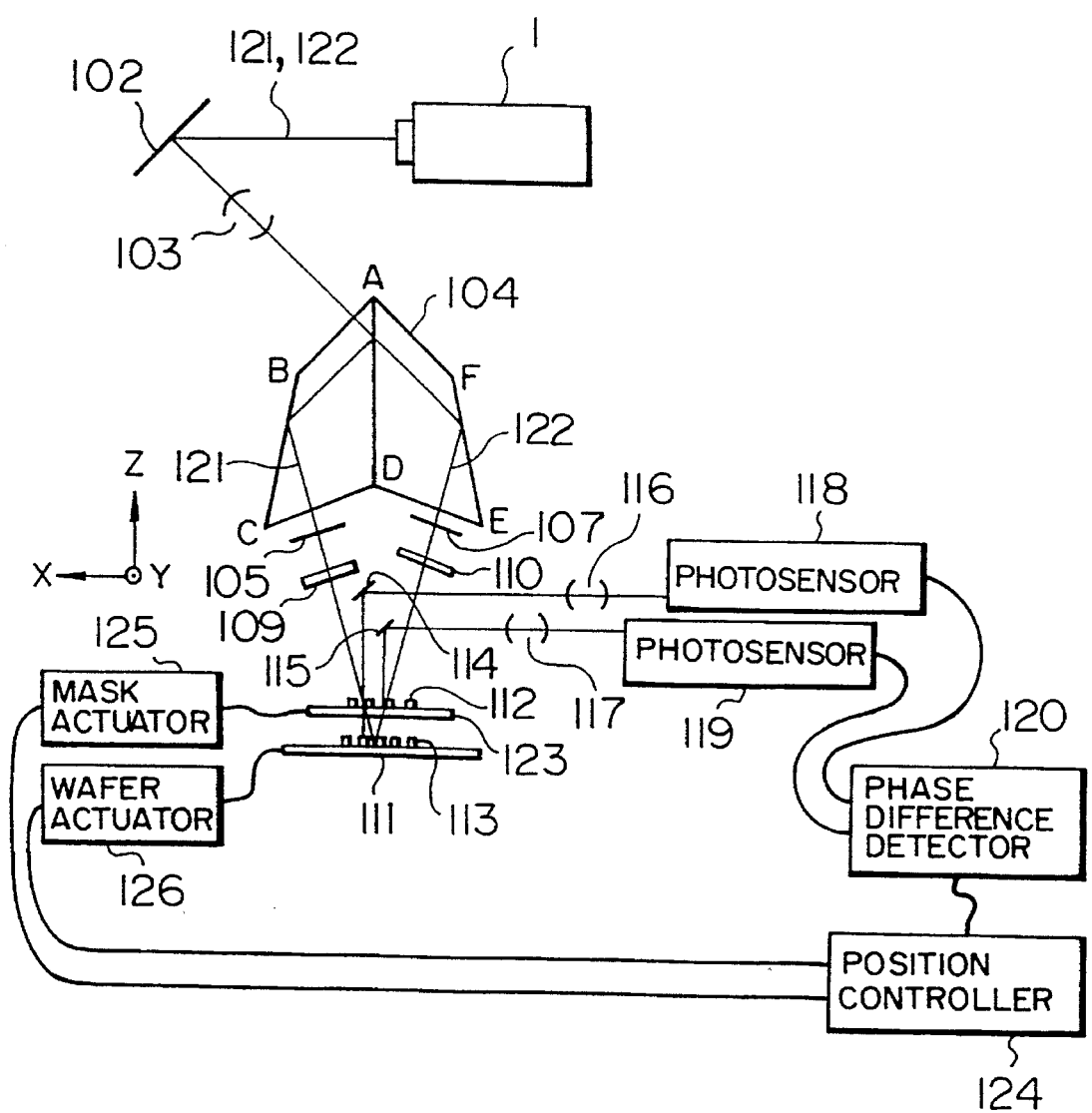
FIG. 13 is a schematic diagram of the optical system of the third embodiment.

FIG. 13 shows the third embodiment of the present invention. Emitted from the Zeeman laser 1 are two rays of light 121 and 122 which share the same optical axis, whose planes of polarization are normal to each other and whose frequencies are slightly different from each other (The ray of light 121 is an S wave, and the ray of light 122 is a P wave).

The respective intensities of these rays of light, i.e., $I_{121}$ and $I_{122}$, can be mathematically expressed as follows:

$$I_{121} = \exp\{i(\omega_1 t)\} \tag{31}$$

$$I_{122} = \exp\{i(\omega_2 t)\} \tag{32}$$

where $\omega_1$ and $\omega_2$ are angular frequencies.

The direction of the two rays of light 121 and 122 is changed by a mirror 102 and the rays are transmitted through a collimator lens 103 before they impinge upon an arrow-shaped prism (arrow-shaped prism) 104, which comprises a polarization beam splitter plane (AD plane) and mirrors (BC plane and EF plane) integral therewith. The two rays of light 121 and 122 incident upon the arrow-shaped prism 104 are divided into two paths by the AD plane (the PBS surface) due to the difference in their planes of polarization. The ray of light 121, which is reflected by the AD planer is further reflected by the BC plane to change its direction and passes through a λ/2 plate 105 and a Wallaston prism 109. The plane of polarization of the ray of light 121 is inclined 45° with respect to the crystal orientation of the Wallaston prism 109. Thus, the ray of light 121 is divided by the Wallaston prism 109 into a ray of light 121S, which is an S-polarized light component, and a ray of light 121P, which is a P-polarized light component. The ray of light 121S is applied to the diffraction grating 112, which is on a mask 123, and the ray of light 121P is applied to the diffraction grating 113, which is on a wafer 111. The ray of light 122, on the other hand, is transmitted through the AD plane, and is reflected by the EF plane to change its direction and passes through a λ/2 plate 107 and a Wallaston prism 110. The plane of polarization of the ray of light 122 is inclined 45° with respect to the crystal orientation of the Wallaston prism 110. Thus, the ray of light 122 is divided by the Wallaston prism 110 into a ray of light 122S, which is an S-polarized light component, and a ray of light 122P, which is a P-polarized light component. The ray of light 122S is applied to the diffraction grating 112 on the mask 123, and the ray of light 122P is applied to the diffraction grating 113 on the wafer 111.

Figure 14:
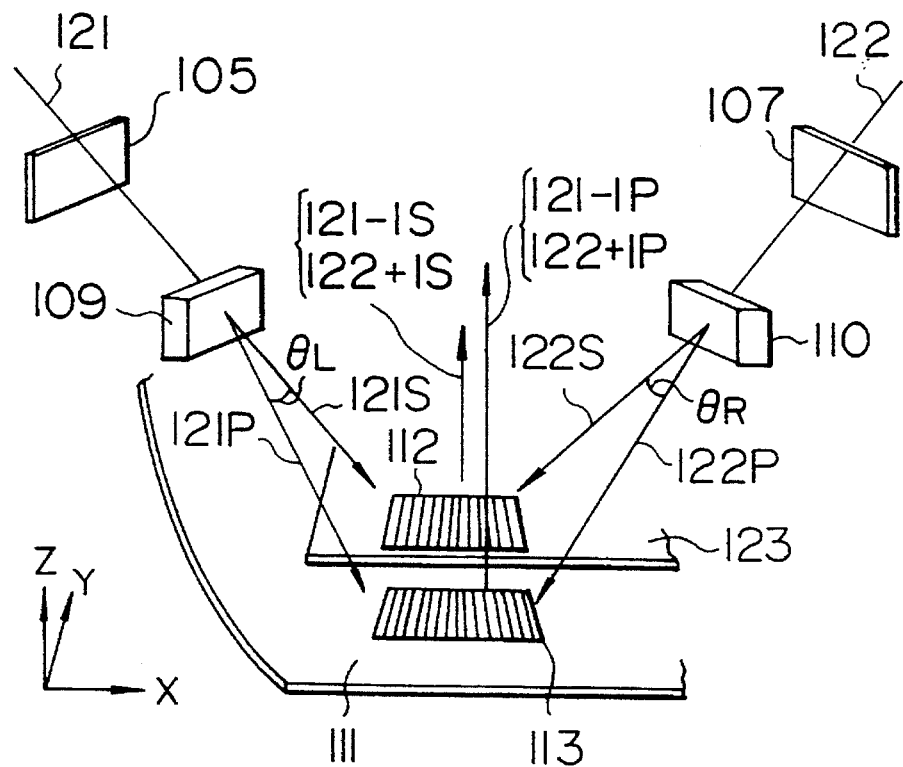
FIG. 14 is a diagram showing a relationship between incident and outgoing rays of light in the third embodiment.

FIG. 14 shows the principle optical paths of the optical system through which the two rays of light 121 and 122, traveling out from the arrow-shaped prism 104, are transmitted until they are diffracted at the diffraction gratings 112 and 113. The rays of light 121P and 121S transmitted from the Wallaston prism 109 are separated from each other by an angle of divergence $\theta_L$, and the rays of light 122P and 122S transmitted from the Wallaston prism 110 are separated from each other by an angle of divergence $\theta_R$. The angles of divergence $\theta_L$ and $\theta_R$ are equal to each other. The rays of light 121S and 122S are diffracted at the diffraction grating 112. As a result, a −1st order diffracted ray 121-1S is obtained from the ray of light 121S, and a +1st order diffracted ray 122+1S is obtained from the ray of light 122S. Similarly, the rays of light 121P and 122P are diffracted at the diffraction grating 113. As a result, a −1st order diffracted ray 121-1P is obtained from the ray of light 121P, and a +1st order diffracted ray 122+1P is obtained from the ray of light 122P. The respective intensities of the four diffracted rays, i.e., I(121−1S), I(122+1S), I(121−1P) and I(122+1P), can be mathematically expressed as follows:

$$I(121-1S) = A \cdot \exp\{i(\omega_1 t - \phi_a)\} \tag{33}$$

$$I(122+1S) = B \cdot \exp\{i(\omega_2 t - \phi_a)\} \tag{34}$$

$$I(121-1P) = C \cdot \exp\{i(\omega_1 t - \phi_b)\} \tag{35}$$

$$I(122+1P) = D \cdot \exp\{i(\omega_2 t - \phi_b)\} \tag{36}$$

Figure 15:
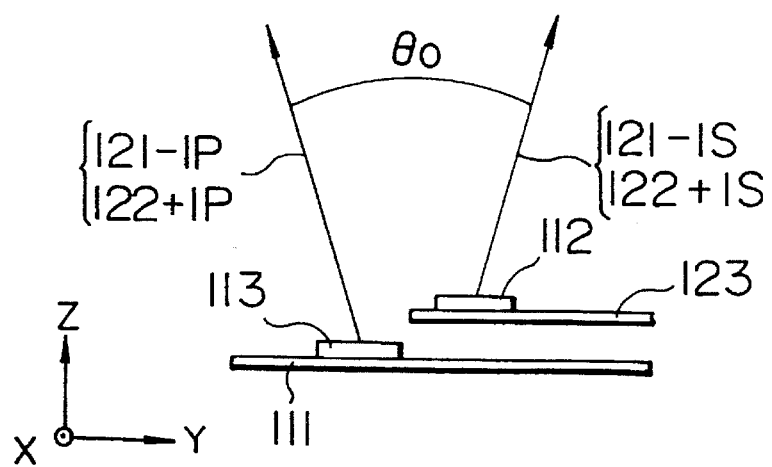
FIG. 15 is a diagram showing a relationship between incident and outgoing rays of light in the third embodiment.

In the above equations, symbols A, B, C and D represent amplitudes; and $\phi_a$ and $\phi_b$ represent phase amounts corresponding to displacements of the diffraction gratings 112 and 113 from certain reference positions. Of the four diffracted rays, those obtained by diffraction at the same diffraction grating are caused to interfere with each other, thus generating two interference rays of light. As stated above, the incident rays of light exhibit angles of divergence with respect to the diffraction gratings, so that, as shown in FIG. 15, the resultant interference rays of light are transmitted along optical paths divergent in the YZ-plane (at an angle of divergence of $\theta_0$). Therefore, it is easy to spatially separate the two interference rays of light from each other by the difference in the angles at which they travel from the diffraction gratings. As shown in FIG. 13, the two interference rays of light are transmitted by way of mirrors 114 and 115 and condensed at photo sensors 118 and 119 by lenses 116 and 117 to undergo photoelectric conversion, with the result that beat signals $U_a$ and $U_b$ can be obtained which include phase amounts corresponding to displacements of the diffraction gratings from certain reference positions.

$$U_a = A^2 + B^2 + 2AB \cdot \cos\{(\omega_2 - \omega_1)t + 2\phi_a\} \tag{37}$$

$$U_b = C^2 + D^2 + 2CD \cdot \cos\{(\omega_2 - \omega_1)t + 2\phi_b\} \tag{38}$$

By inputting the two beat signals expressed by equations (37) and (38) to a phase difference detector 120, which consists of a lock-in amplifier or the like, it is possible to obtain the phase difference between the two beat signals:

$$\Delta\phi = 2(\phi_b - \phi_a) \tag{39}$$

Thus, it is possible to obtain the relative displacement of the two gratings from equation (16). When this relative displacement is input to a position controller 124 for the mask and wafer and fed back into actuators 125 and 126 for driving the mask and wafer, respectively, it is possible to position the mask relative to the wafer with a high level of high accuracy.

Figure 16:
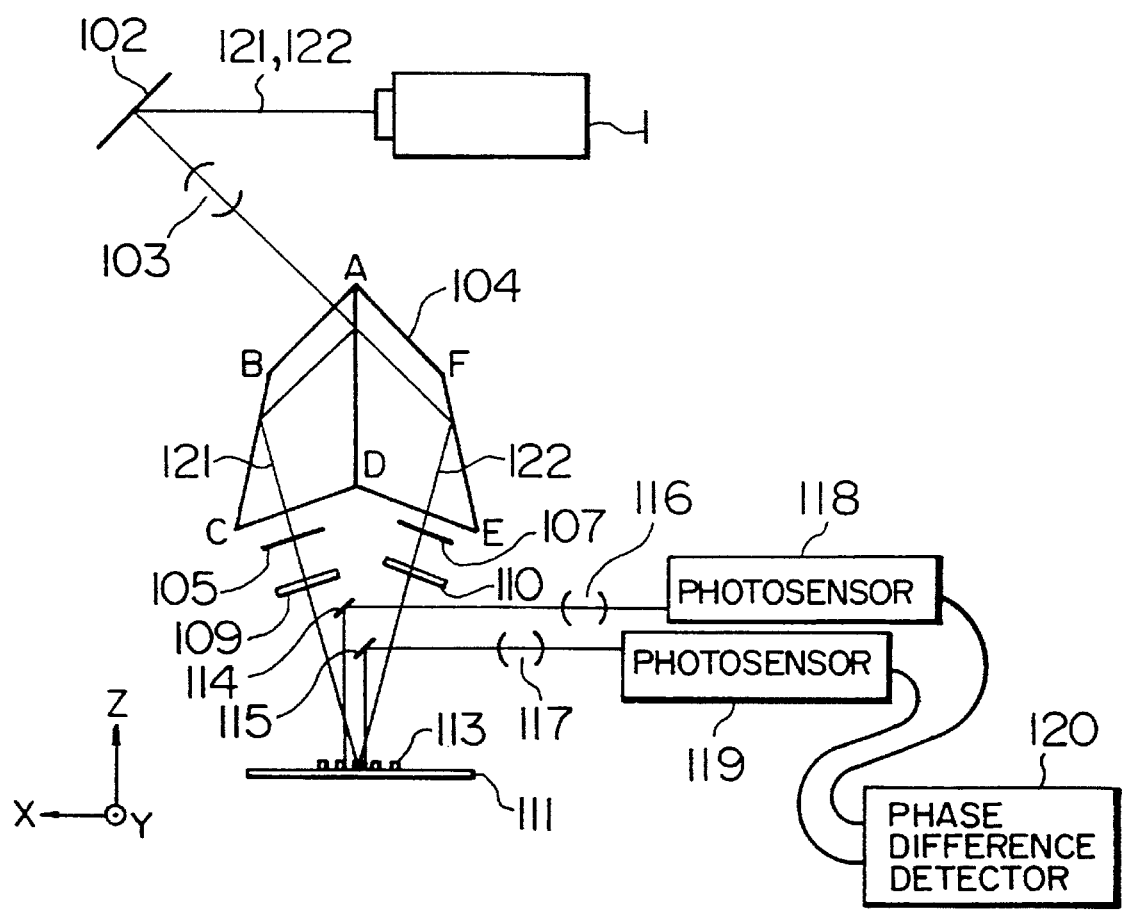
FIG. 16 is a schematic diagram of the optical system of a fourth embodiment of the present invention.

FIG. 16 shows the fourth embodiment of the present invention. Emitted from the Zeeman laser 1 are two rays of light 121 and 122 which share the same optical axis, whose planes of polarization are normal to each other and whose frequencies are slightly different from each other (The ray of light 121 is an S wave, and the ray of light 122 is a P wave).

The respective intensities of these rays of light, i.e., $I_{121}$ and $I_{122}$, can be mathematically expressed as follows:

$$I_{121} = \exp\{i(\omega_1 t)\} \tag{40}$$

$$I_{122} = \exp\{i(\omega_2 t)\} \tag{41}$$

where $\omega_1$ and $\omega_2$ are angular frequencies as in the above-described case.

The direction of the two rays of light 121 and 122 is changed by a mirror 102 and the rays of light are transmitted through a collimator lens 103 before they impinge upon an arrow-shaped prism 104, which comprises a polarization beam splitter plane (AD plane) and mirrors (BC plane and EF plane) integral therewith. The two rays of light 121 and 122 incident upon the arrow-shaped prism 104 are divided into two paths by the AD plane (the polarization beam splitter plane) due to the difference in their planes of polarization. The ray of light 121, which is reflected by the AD plane, is further reflected by the BC plane to change its direction and passes through λ/2 plate 105 and a Wallaston prism 109. The plane of polarization of the ray of light 121 is inclined 45° with respect to the crystal orientation of the Wallaston prism 109. Thus, the ray of light 121 is divided by the Wallaston prism 109 into a ray of light 121S, which is an S-polarized light component, and a ray of light 121P, which is a P-polarized light component. The ray of light 121S is applied to a diffraction grating 112 (not shown in FIG. 16), which is on a wafer 111, and the ray of light 121P is applied to a diffraction grating 113, which is on a wafer 111. The ray of light 122, on the other hand, is transmitted through the AD plane, and is reflected by the EF plane and passes through a λ/2 plate 107 and a Wallaston prism 110. The plane of polarization of the ray of light 122 is inclined 45° with respect to the crystal orientation of the Wallaston prism 110. Thus, the ray of light 122 is divided by the Wallaston prism 110 into a ray of light 122S, which is an S-polarized light component, and a ray of light 122P, which is a P-polarized light component. The ray of light 122S is applied to the diffraction grating 112 on the wafer 111, and the ray of light 122P is applied to the diffraction grating 113 on the wafer 111.

Figure 17:
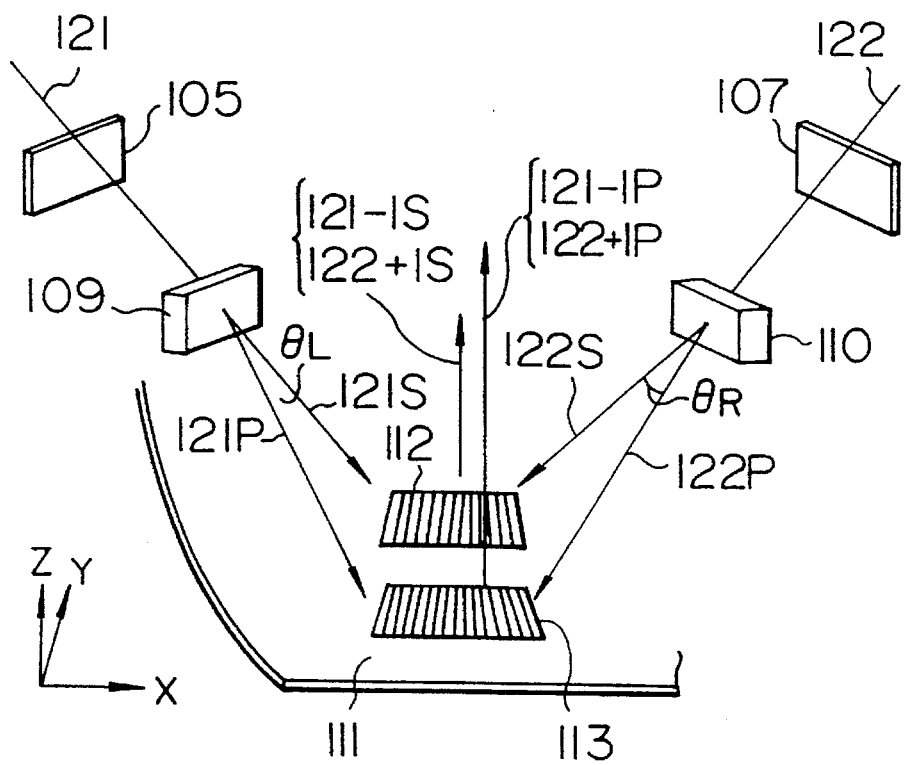
FIG. 17 is a diagram showing a relationship between incident and outgoing rays of light in the fourth embodiment.

FIG. 17 shows the principle optical paths of the optical system through which the two rays of light 121 and 122, transmitted from the arrow-shaped prism 104, are transmitted until they are diffracted at the diffraction gratings 112 and 113. The rays of light 121P and 121S transmitted from the Wallaston prism 109 are separated from each other by an angle of divergence $\theta_L$, and the rays of light 122P and 122S outgoing from the Wallaston prism 110 are separated from each other by an angle of divergence $\theta_R$. These angles of divergence, $\theta_L$ and $\theta_R$, are equal to each other. The rays of light 121S and 122S are diffracted at the diffraction grating 112. As a result, a −1st order diffracted ray 121-1S is obtained from the ray of light 121S, and a +1st order diffracted ray 122+1S is obtained from the ray of light 122S. Similarly, the rays of light 121P and 122P are diffracted at the diffraction grating 113. As a result, a −1st order diffracted ray 121−1P is obtained from the ray of light 121P, and a +1st order diffracted ray 122+1P is obtained from the ray of light 122P. The respective intensities of the four diffracted rays, i.e., I(121−1S), I(122+1S), I(121−1P) and I(122+1P), can be mathematically expressed as follows:

$$I(121-1S) = A \cdot \exp\{i(\omega_1 t - \phi_a)\} \tag{42}$$

$$I(122+1S) = B \cdot \exp\{i(\omega_2 t - \phi_a)\} \tag{43}$$

$$I(121-1P) = C \cdot \exp\{i(\omega_1 t - \phi_b)\} \tag{44}$$

$$I(122+1P) = D \cdot \exp\{i(\omega_2 t - \phi_b)\} \tag{45}$$

Figure 18:
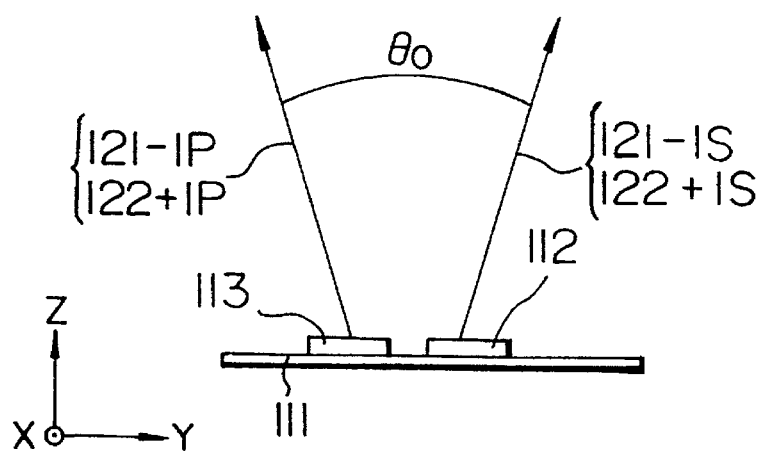
FIG. 18 is a diagram showing a relationship between incident and outgoing rays of light in the fourth embodiment.

In the above equations, symbols A, B, C and D represent amplitudes; and $\phi_a$ and $\phi_b$ represent phase amounts corresponding to displacements of the diffraction gratings 112 and 113 from certain reference positions. Of the four diffracted rays, those obtained by diffraction at the same diffraction grating are caused to interfere with each other, thus generating two interference rays of light. As stated above, the applied rays of light exhibit angles of divergence with respect to the diffraction gratings, so that, as shown in FIG. 18, the resultant interference rays of light take optical paths divergent in the YZ-plane. Therefore, it is easy to spatially separate the two interference rays of light from each other by the difference in the angles at which they travel from the gratings. As shown in FIG. 16, the two interference rays of light are transmitted by way of mirrors 114 and 115 and are condensed at photo sensors 118 and 119 by lenses 116 and 117 to undergo photoelectric conversion, with the result that beat signals $U_a$ and $U_b$ can be obtained which include phase amounts corresponding to displacements of the diffraction gratings from certain reference positions.

$$U_a = A^2 + B^2 + 2AB \cdot \cos\{(\omega_2 - \omega_1)t + 2\phi_1\} \tag{46}$$

$$U_b = C^2 + D^2 + 2CD \cdot \cos\{(\omega_2 - \omega_1)t + 2\omega_b\} \tag{47}$$

By inputting the two beat signals expressed by equations (46) and (47) to a phase difference detector 120, which consists of a lock-in amplifier or the like, it is possible to obtain the phase difference between the two beat signals:

$$\Delta\phi = 2(\phi_b - \phi_a) \tag{48}$$

Thus, as in the above-described embodiment, it is possible to obtain the relative displacement of the two gratings.

Suppose, of the two diffraction gratings on the wafer, the diffraction grating 112 is printed on the wafer 111 as a first layer and then the mask is positioned relative to the wafer by an automatic alignment device to print the diffraction grating 113 as a second layer. When, in this case, the relative displacement of the two diffraction gratings on the wafer 111 is measured, it is possible to evaluate the performance of the automatic alignment device as in the above-described case.

The following is a description of the principle of the embodiments which will be described below.

Figure 20:
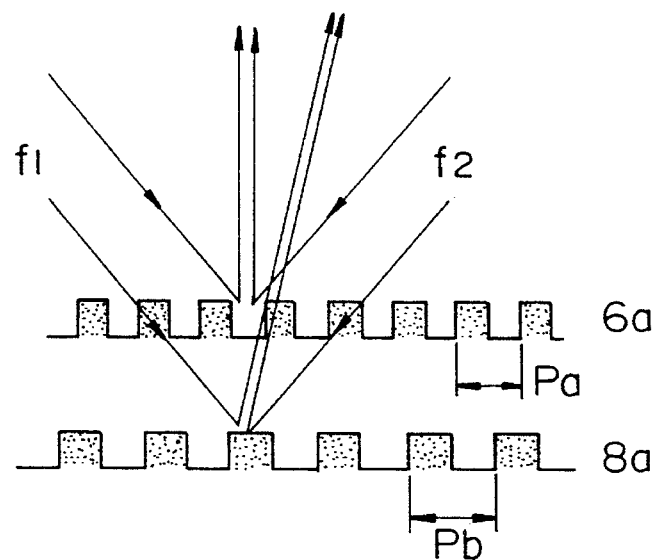
FIG. 20 is diagram illustrating the directions of diffracted rays from two diffraction gratings having different pitches.

With reference to FIG. 20, rays of light whose frequencies are f1 and f2 are caused to impinge, at predetermined angles, upon two diffraction gratings 6a and 8a from the right and left (as seen in the drawing). Of the diffracted rays from the diffraction grating 6a, the diffracted ray having a frequency of f1 and the diffracted ray having a frequency of f2 and diffracted in the same direction are caused to interfere with each other, thereby generating a first interference or beat ray of light. On the other hand, of the diffracted rays from the diffraction grating 8a, the diffracted ray having a frequency of f1 and the diffracted ray having a frequency of f2 and diffracted in the same direction are caused to interfere with each other, thereby generating a second interference or beat ray of light. Since the respective pitches of the diffraction gratings 6a and 8a are different from each other, the first and second beat rays of light travel in different directions, so that they can be easily separated from each other. The two beat rays of light undergo photoelectric conversion at a photoelectric converter, thereby providing two beat signals. Further, the angles of incidence of the incident rays of light, the pitches of the diffraction gratings 6a and 8a, and the orders of the diffracted rays used in the measurement are set in such a way that the difference in phase between the two beat signals, $\Delta\phi$, is proportional to the relative displacement $\Delta X$ of the diffraction gratings 6a and 8a. The phase difference $\Delta\phi$ between the two beat signals detected by the phase difference meter is converted to the relative displacement of the diffraction gratings.

Figure 19:
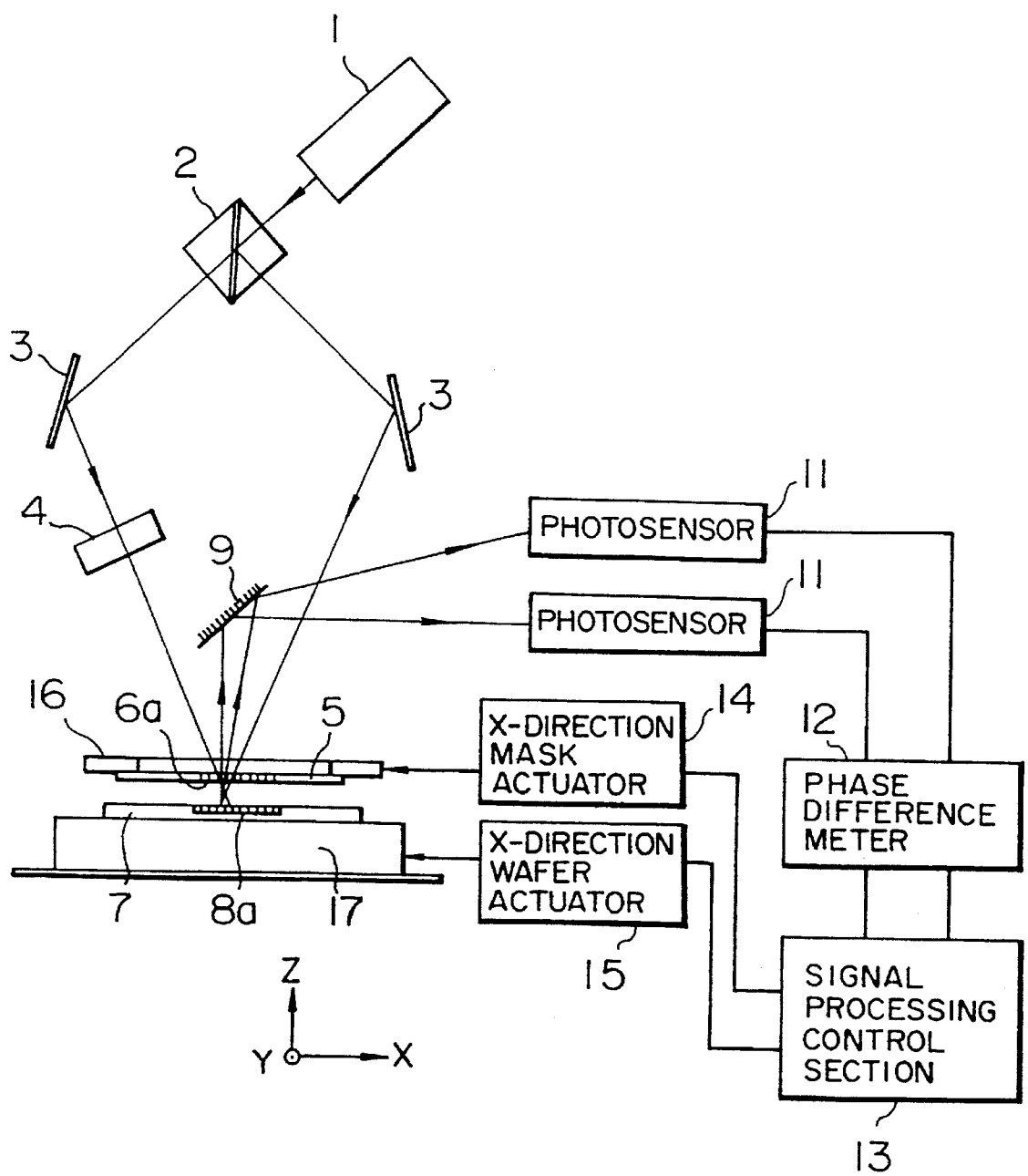
FIG. 19 is a schematic diagram illustrating a positioning device according to a fifth embodiment of the present invention.

FIG. 19 shows the fifth embodiment of the present invention, which is applied to the positioning device of a semiconductor exposure apparatus. Referring to FIG. 19, numeral 1 indicates a double-channel Zeeman laser; numeral 2 denotes a polarization beam splitter; numeral 3 denotes mirrors; numeral 4 denotes a half-wave plate; numeral 5 denotes a mask; numeral 6a denotes a diffraction grating on the mask; numeral 7 denotes a wafer; numeral 8a denotes a diffraction grating on the wafer; numeral 9 denotes a mirror; numeral 11 denotes photo sensors; numeral 12 denotes a phase difference meter; numeral 13 denotes a signal processing control section; numeral 14 denotes an actuator for driving the mask in the X-direction; numeral 15 denotes an actuator for driving the wafer in the X-direction; numeral 16 denotes a mask stage; and numeral 17 denotes a wafer stage.

Rays of light from the Zeeman laser 1 having frequencies of f1 and f2 are divided into two paths by the polarization beam splitter 2. The ray of light whose frequency is f1 (the S-polarized light), which is reflected by the polarization beam splitter 2, and the ray of light whose frequency is f2 (the P-polarized light), which is transmitted through the polarization beam splitter 2, are deflected by the mirrors 3 so as to impinge, at predetermined angles, upon the diffraction grating 6a on the mask 5 and the diffraction grating 8a on the wafer 7, respectively. The ray of light whose frequency is f1 is transmitted through the half-wave plate 4 and undergoes a 90° change in the direction of polarization to become a P-polarized light before impinging upon the diffraction grating 6a.

Figure 21:
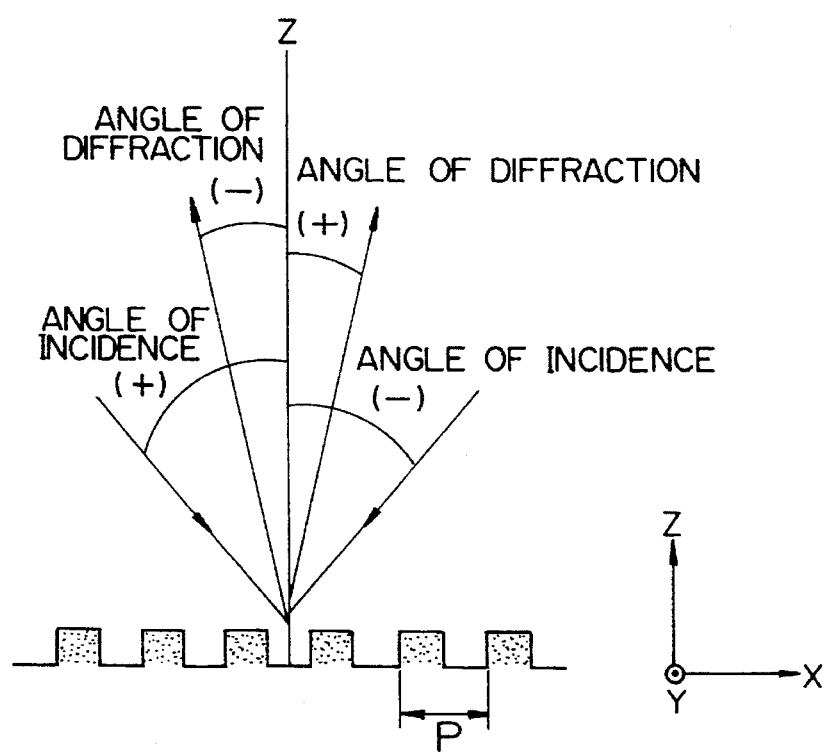
FIG. 21 is a diagram showing the way signs are imparted to angles of incidence and angles of diffraction.

When, as shown in FIG. 20, the pitches of the diffraction gratings 6a and 8a are different from each other, the diffracting direction of the diffraction grating 6a is different from that of the diffraction grating 8a, thereby facilitating separation of the diffracted rays traveling out from the diffraction gratings. The following equations hold true with respect to these diffraction gratings (As shown in FIG. 21, the angle of incidence is positive when measured counter-clockwise from the Z-axis and negative when measured clockwise therefrom, which is reversed with the angle of diffraction):

$$Pa(\sin \theta in - \sin \theta a) = ma\lambda \quad (49)$$

$$Pb(\sin \theta in - \sin \theta b) = mb\lambda \quad (50)$$

where Pa represents the pitch of the diffraction grating 6a; Pb represents the pitch of the diffraction grating 8a; θin represents the angle of incidence; λ represents the wavelength of the ray of light; θa represents the angle of diffraction of the diffraction grating 6a; ma represents the order of diffraction; θb represents the angle of diffraction of the diffraction grating 8a; and mb represents the order of diffraction.

Assuming that the pitch of the diffraction grating 6a, i.e., Pa, is 2 μm, the pitch of the diffraction grating 8a, Pb, is 3 μm, and the wavelength of the ray of light, X, is 0.6328 μm, the angle of incidence θin which causes the 1 and −1st order diffracted rays from the diffraction grating 6a to be directed vertically upward (θa=0) can be obtained, from equation (49), as:

$$\theta in = \sin^{-1}(\lambda/Pa) = 18.4°$$

Further, by using the 2nd order diffracted ray of the incident light on the left-hand side and the −1st order diffracted ray of the incident light on the right-hand side, θb is obtained from equation (50) as follows:

$$\begin{aligned}\theta b &= \sin^{-1}(2 \cdot \lambda/Pb - 1 \cdot \lambda/Pa) & \text{(2nd order)}\\ &= \sin^{-1}(-1 \cdot \lambda/Pb + 1 \cdot \lambda/Pa) & \text{(−1st order)}\\ &= 6.1°\end{aligned}$$

Thus, the 2nd order and −1st order diffracted rays from the diffraction grating 8a are both diffracted in a direction clockwise deviating by 6.1° from the Z-axis. Interference occurs between the +1st order diffracted rays from the diffraction grating 6a, and between the 2nd and −1st order diffracted rays from the diffraction grating 8a, and since their frequencies are slightly different, the diffracted-ray interference rays of light provide two optical beat signals of a beat frequency of (f1−f2).

In the case of FIG. 19, the 1st order diffracted ray of light $E_M$ (1) and the −1st order diffracted ray of light $E_M$ (1), generated by the diffraction grating 6a, can be expressed as follows in terms of complex amplitudes:

$$E_M(1) = A_M \cdot \exp\{i(2\pi f1 + \phi_1 + \phi_M)\} \quad (51)$$

$$E_M(-1) = B_M \cdot \exp\{i(2\pi f2 + \phi_2 - \phi_M)\} \quad (52)$$

In the above equations, $A_M$ and $B_M$ represent amplitudes; $\phi_1$ and $\phi_2$ represent initial phases of the rays of light; and $\phi_M$ represents a change in phase resulting from a displacement in the x-direction, $\Delta X_M$, of the mask 5. Assuming that the pitch of the diffraction grating 6a is Pa, $\phi_M = 2\pi\Delta X_M/Pa$.

The 2nd order diffracted ray of light $E_W$ (2) and the −1st order diffracted ray of light $E_W$ (−1), generated by the diffraction grating 8a, can be expressed as follows in terms of complex amplitudes:

$$E_W(2) = A_W \cdot \exp\{i(2\pi f1 + \phi_1 + 2\phi_W)\} \quad (53)$$

$$E_W(-1) = B_W \cdot \exp\{i(2\pi f2 + \phi_2 - \phi_W)\} \quad (54)$$

In the above equations, $A_W$ and $B_W$ represent amplitudes; $\phi_1$ and $\phi_2$ represent initial phases of the rays of light; and $\phi_W$ represents a change in phase resulting from a displacement in the x-direction, $\Delta X_W$, of the mask wafer 6. Assuming that the pitch of the diffraction grating 8a is Pb, $\phi_W = 2\pi\Delta X_W/Pb$.

A change, IM, in the intensity of light when the two rays of light expressed by equations (51) and (52) are superimposed one upon the other can be expressed as follows:

$$IM = AM^2 + BM^2 + AMBM \cdot \cos\{(2\pi(f1-f2)t + (\phi_1-\phi_2) + 2\phi_M\} \quad (55)$$

A change, IW, in the intensity of light when the two rays of light expressed by equations (53) and (54) are superimposed one upon the other can be expressed as follows:

$$IW = AW^2 + BW^2 + AWBW \cdot \cos\{(2\pi(f1-f2)t + (\phi_1\phi_2) + 3\phi_W\} \quad (56)$$

The two diffracted-ray interference rays of light expressed by equations (55) and (56) are photoelectrically detected by the photo sensors 11. The two beat signals, photoelectrically detected, are introduced into the phase difference meter 12 so as to measure the phase difference Δφ therebetween, which can be expressed as:

$$\begin{aligned}\Delta\phi &= 2\phi_M - 3\phi_W\\ &= 2\pi(2\Delta X_M/Pa - 3\Delta X_W/Pb)\end{aligned}$$

When Pa=2 μm and Pb=3 μm, $\Delta\phi = 2\pi(\Delta XM - \Delta XW)$, so that the relative displacement of the mask 5 and the wafer 7, ΔXM−ΔXW, is detected by the signal processing control section 13 on the basis of the Δφ measured by the phase difference meter 12. On the basis of this value, a drive command is supplied to at least one of the well-known actuators: the actuator 14 for driving the mask in the X-direction and the actuator 15 for driving the wafer 7 in the X-direction, thereby positioning the mask 5 relative to the wafer 7.

Further, it is also possible, though omitted in the above description, to provide a similar system for positioning in the Y-direction to perform a similar positioning in the Y-direction, too. Moreover, though in the above description +1st order, 2nd order and −1st order diffracted rays of light were used, the present invention is not limited to these types of rays. This measurement is also possible with other diffraction-grating pitches and other diffraction orders by effecting, on the basis of equations (49) and (50), a 1:1 correspondence between the relative displacement ΔXM−ΔXW and the phase difference Δφ of the beat signals and causing the diffracted-ray interference rays of light traveling out from the two diffraction gratings to be diffracted in different directions.

Figure 22:
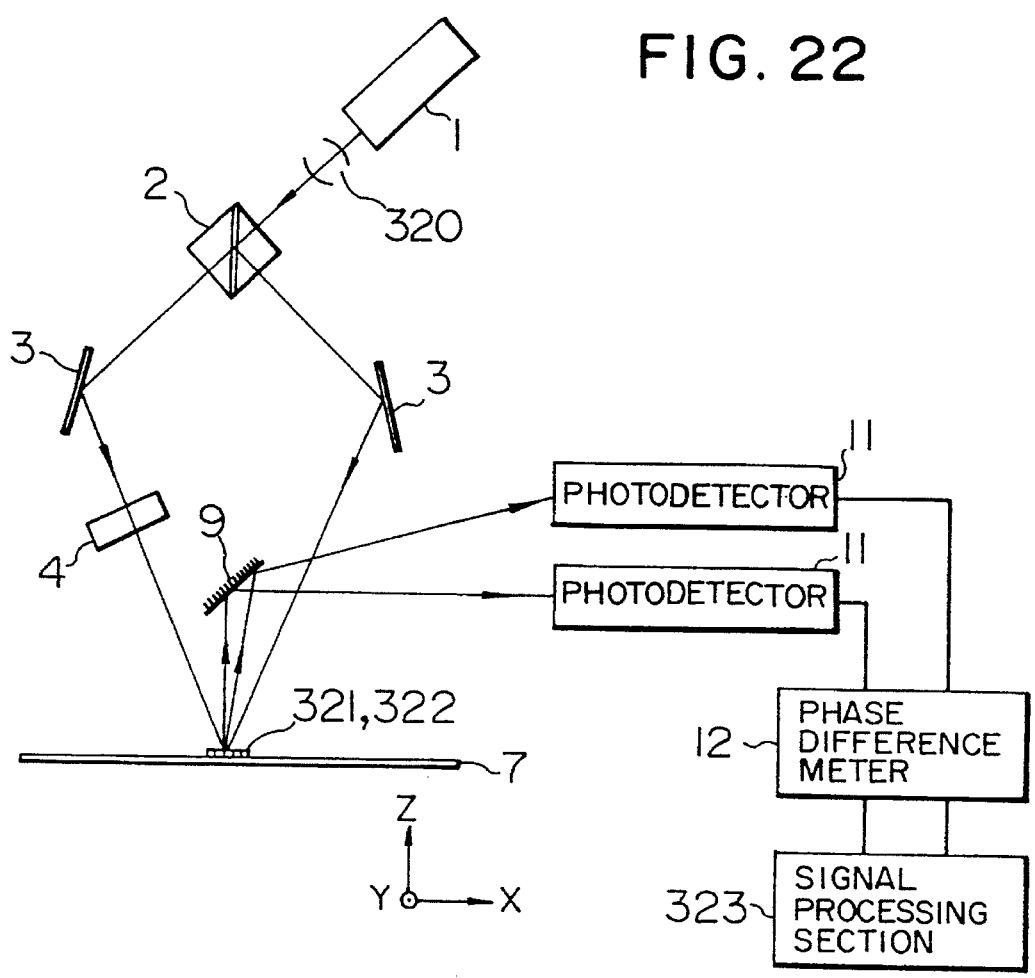
FIG. 22 is a schematic diagram illustrating a superimposition accuracy measuring device according to a sixth embodiment of the present invention.

FIG. 22 shows the sixth embodiment of the present invention, which is applied to a superimposition accuracy measuring device in a semiconductor exposure apparatus. Referring to FIG. 22, numeral 1 indicates a double-channel Zeeman laser; numeral 2 denotes a polarization beam splitter; numeral 3 denotes mirrors; numeral 4 denotes a half-wave plate; numeral 7 denotes a wafer; numeral 9 denotes a mirror; numeral 11 denotes photo sensors; numeral 12 denotes a phase difference meter; and numeral 323 denotes a signal processing section.

First, a method of preparing diffraction gratings 321 and 322 will be described. Through a semiconductor printing process, a first diffraction grating is provided on a mask (reticle), which is transferred by printing onto the wafer 7, thereby preparing the first diffraction grating 321 (the 1st layer). Afterwards, a second diffraction grating having a pitch which is different from that of the above-mentioned first diffraction grating is provided at a predetermined position on the same or a different mask, and, after positioning the mask relative to the wafer, the second diffraction grating is transferred by printing onto a position adjacent to the diffraction grating 321 on the wafer 7, thereby preparing the diffraction grating 322 (the 2nd layer).

Next, the principle of superimposition accuracy measurement according to the present invention will be described. Rays of light emitted from the Zeeman laser 1, having frequencies of f2 and f3, are transmitted through a collimator lens 320 and divided into two paths by the polarization beam splitter 2. The ray of light whose frequency is f1 (S-polarized light), which is reflected by the polarization beam splitter 2, and the ray of light whose frequency is f2 (P-polarized light), which is transmitted through the polarization beam splitter 2, are deflected by the mirrors 3 so as to impinge, at predetermined angles, upon the two adjacent diffraction gratings 321 and 322 on the wafer 7.

Figure 23:
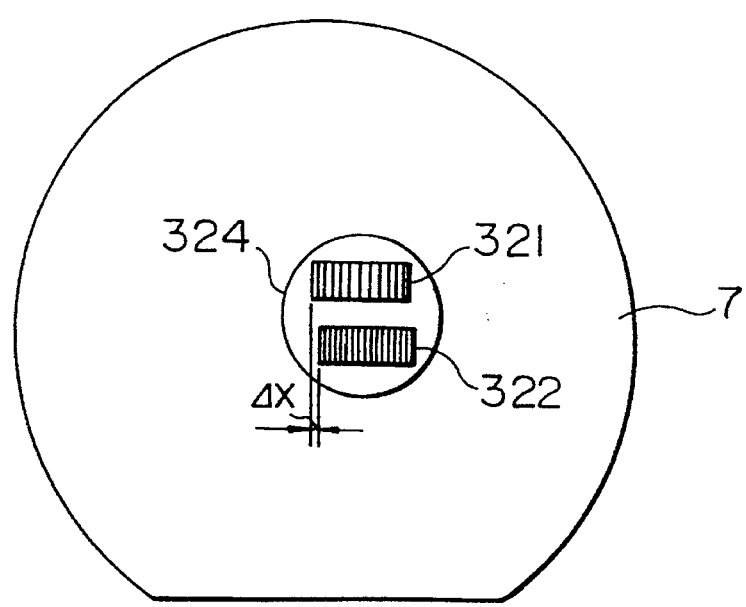
FIG. 23 is a diagram showing a beam spot on a wafer in the sixth embodiment.

The two diffraction gratings 321 and 322 are formed by separate printing processes, and, as shown in FIG. 23, exhibit a relative displacement $\Delta X$ generated during the printing. Further, numeral 324 in FIG. 23 indicates a beam spot on the wafer 7 which is stopped down by the collimator lens 320. The light spots of the incident rays of light from the right and left overlap each other and cover the entire area of the two diffraction gratings 321 and 322.

The ray of light whose frequency is f1 is transmitted through the half-wave plate 4 and the plane of polarization thereof is turned by 90° to become P-polarized light before impinging upon the grating.

The diffraction gratings 321 and 322 have different directions of diffraction, thus facilitating separation of the diffracted rays therefrom.

As in the first embodiment, it is assumed here that the pitch of the diffraction grating 321 is 2 μm, the pitch of the diffraction grating 322 is 3 μm, and the angle of incidence $\theta$in is 18.4°.

In the case of FIG. 22, the 1st order diffracted ray E1 (1) and the −1st order diffracted ray E1 (−1), generated by the diffraction grating 321, can be expressed as follows in terms of complex amplitudes:

$$E1(1)=A1 \cdot \exp\{i(2\pi f1+\phi_1+\phi1)\} \quad (57)$$

$$E1(-1)=B1 \cdot \exp\{i(2\pi f2+\phi_2-\phi1)\} \quad (58)$$

In the above equations, A1 and B1 represent amplitudes; $\phi_1$ and $\phi_2$ represent initial phases of the rays of light; and $\phi1$ represents a change in phase resulting from a displacement $\Delta X1$ in the x-direction of the diffraction grating 321. Assuming that the pitch of the diffraction grating 321 is P1, $\phi1=2\pi\Delta X1/P1$.

The 2nd order diffracted ray E2(2) and the −1st order diffracted ray E2(−1), generated by the diffraction grating 322, can be expressed as follows in terms of complex amplitudes:

$$E2(2)=A2 \cdot \exp\{i(2\pi f1+\phi_1+2\phi2)\} \quad (59)$$

$$E2(-1)=B2 \cdot \exp\{i(2\pi f2+\phi_2-\phi2)\} \quad (60)$$

In the above equations, A2 and B2 represent amplitudes; $\phi_1$ and $\phi_2$ represent the initial phases of the rays of light; and $\phi_2$ represents a change in phase resulting from a displacement $\Delta X1$ in the x-direction of the diffraction grating 322. Assuming that the pitch of the diffraction grating 322 is P2, $\phi_W=2\pi\Delta X_W/P2$. A change I1 in intensity of light when the two rays of light expressed by equations (57) and (58) are superimposed one upon the other can be expressed as follows:

$$I1=A1^2+B1^2+A1B1 \cdot \cos\{(2\pi(f1-f2)t+(\phi_1-\phi_2)+2\phi1\} \quad (61)$$

A change I2 in the intensity of light when the two rays of light expressed by equations (59) and (60) are superimposed one upon the other can be expressed as follows:

$$I2=A2^2+B2^2+A2B2 \cdot \cos\{2\pi(f1-f2)t+(\phi_1-\phi_2)+3\phi2\} \quad (62)$$

The two diffracted-ray interference rays of light expressed by equations (61) and (62) are photoelectrically detected by the photo sensors 11. The two beat signals, photoelectrically detected, are introduced into the phase difference meter 12 so as to measure the phase difference $\Delta\phi$ therebetween, which can be expressed as:

$$\Delta\phi = 2\phi_1 - 3\phi_2$$
$$= 2\pi(2\Delta X1/P1 - 3\Delta X1/P1)$$

When P1=2 μm and P1=3 μm, $\Delta\phi=2\pi(\Delta X1-X2)$, so that the relative displacement of the diffraction gratings 321 and 322, i.e., the error in superimposition in the X-direction of the 1st and 2nd layers, $\Delta X$(μm), is calculated by the signal processing section 323, as shown in the following equation, on the basis of the $\Delta\phi$ measured by the phase difference meter 12.

$$\Delta X=\Delta X1-\Delta X2=\Delta\phi/2\pi \quad (63)$$

Further, it is also possible, though omitted in the above description, to provide a similar system for positioning in the Y-direction to perform a similar positioning in the Y-direction, too. Moreover, though in the above description ±1st order, 2nd order and −1st order diffracted rays of light were used, with the pitches of the two diffraction gratings being 2 μm and 3 μm, the present invention is not limited to these rays and pitches. The measurement is also possible with other diffraction-grating pitches and other diffraction orders by effecting a 1:1 correspondence between the superimposition error $\Delta X$ and the phase difference $\Delta\phi$ of the beat signals and causing the diffracted-ray interference rays of light from the two diffraction gratings to be diffracted in different directions.

As described above, in the above fifth and sixth embodiments, two diffraction gratings having different pitches are used as measurement marks in the positioning device and the superimposition accuracy measuring device of a semiconductor exposure apparatus utilizing the optical heterodyne interference measurement method, and, by using rays of light whose orders of diffraction are such that the directions of diffraction of the-resultant diffracted-ray interference rays of light (the optical beat signals) generated by the diffraction gratings are different, various advantages are provided. For example, it is possible to utilize approximately double the light quantity as compared to the conventional method, where one of the two rays of light is cut off by a knife edge. Thus, measurement can be performed with higher accuracy, with an improved S/N ratio and without being influenced by scattered light due to the edge. Further, the setting of the optical system is facilitated.

As stated above, the present invention makes it possible to utilize approximately double the light quantity as compared to the conventional method, where one of the two rays of light is cut off by a knife edge. Further, since the two rays of light obtained by the diffraction gratings can be accurately separated, there is no crosstalk between the two rays of light, thus enabling displacement measurement to be performed with high accuracy.

What is claimed is:

1. A device for detecting a relative displacement between first and second diffraction gratings which are arranged close to each other, said device comprising:

a light source emitting light of two different wavelengths and directions of polarization;

an interference optical system, said interference optical system causing the light beams emitted by said light source to split into first, second, third, and fourth light beams, the first light beam having a first wavelength and a first direction of polarization and the second light beam having a second wavelength different from the first wavelength and having the first direction of polarization, said interference optical system causing the first and second light beams to be diffracted by the first diffraction grating so as to generate two diffracted light beams and causing these two diffracted light beams to interfere with each other so as to form a first interference light beam of the first direction of polarization, wherein the third light beam is light of the first wavelength and a second direction of polarization different from the first direction of polarization, wherein the fourth light beam is light of the second wavelength and the second direction of polarization, said interference optical system causing the third light beam and the fourth light beam to be diffracted by the second diffraction grating so as to generate two diffracted light beams and causing the two diffracted rays diffracted by the second diffraction grating to interfere with each other so as to form a second interference light beam of the second direction of polarization, said interference optical system separating the first and second interference light beams from each other on the basis of the difference in their directions of polarization;

a first detector for detecting the first interference light beam to generate a first detection signal;

a second detector for detecting the second interference light beam to generate a second detection signal; and a signal processing section for detecting the phase difference between the first and second detection signals, and for determining the relative displacement between the first and second diffraction gratings on the basis of the phase difference, wherein the first and second diffraction gratings comprise groups of linear gratings each arranged at equal intervals, the pitch of the first diffraction grating being different from that of the second diffraction grating, and wherein said interference optical system causes the first and third light beams to impinge upon the first and second diffraction gratings, respectively, from a first direction and causes the second and fourth light beams to impinge upon the first and second diffraction gratings, respectively, from a second direction which is different from the first direction.

2. A device according to claim 1, wherein the angles of incidence of the first, the second, the third, and the fourth light beams, the pitches of the first and second diffraction gratings and the orders of diffraction of the diffracted light beams that are to undergo interference are set in such a way that the phase difference between the first and second detection signals is proportional to the relative displacement of the first and second diffraction gratings.

3. A method of detecting the relative displacement between first and second diffraction gratings which are arranged to be close to each other, said method comprising:

an emitting step of emitting light of two different wavelengths and directions of polarization;

an interference step comprising the steps of:

splitting the light emitted in said emitting step into first, second, third, fourth light beams, the first light beam having a first wavelength and a first direction of polarization, the second light beam having a second wavelength different from the first wavelength and the first direction of polarization, the third light beam having the first wavelength and a second direction of polarization different from the first direction of polarization, and the fourth light beam having the second wavelength and the second direction of polarization;

diffracting the first light beam and the second light beam by the first diffraction grating so as to generate two diffracted light beams, causing the two diffracted light beams to interfere with each other so as to form a first interference light beam of the first direction of polarization, diffracting the third light beam and the fourth light beam by the second diffraction grating so as to generate two diffracted light beams, and causing the two diffracted light beams diffracted by the second diffraction grating to interfere with each other so as to form a second interference light beam of the second direction of polarization;

a separation step in which the first and second interference light beams are separated from each other by the difference in their directions of polarization;

a light detection step comprising the steps of detecting the first interference light beam and generating a first detection signal in response to said detecting step, and detecting the second interference light beam and generating a second detection signal in response to detecting the second interference light beam; and a phase difference detection step comprising the steps of detecting the phase difference between the first and second detection signals and determining the relative displacement between the first and second diffraction gratings on the basis of the detected difference, and the step of forming the first and second diffraction gratings of groups of linear gratings at equal intervals, the pitch of the first diffraction grating being different from that of the second diffraction grating, and wherein said separation step comprises the steps of causing the first and third light beams to impinge upon the first and second diffraction gratings, respectively, from a first direction and causing the second and fourth light beams to impinge upon the first and second diffraction gratings, respectively, from a second direction which is different from the first direction.

4. A method according to claim 3, further comprising the step of setting the angles of incidence of the first, the second, the third, and the fourth light beams, the pitches of the first and second diffraction gratings and the orders of diffraction of the diffracted light beams that are to undergo interference in such a way that the phase difference between the first and second detection signals is proportional to the relative displacement between the first and second diffraction gratings.

5. A method according to claim 3, wherein said separation step comprises the steps of using polarizing means for making the direction of polarization of the first and second light beams different from the direction of polarization of the third and fourth light beams, and using a polarization beam splitter for separating the first and second interference rays of light from each other.

6. A device for detecting the relative displacement between first and second diffraction gratings which are arranged close to each other, said device comprising:

an interference optical system, said interference optical system causing a first light beam having a first wavelength and a second light beam having a second wavelength different from the first wavelength to be diffracted by the first diffraction grating so as to generate two diffracted light beams and causing these two diffracted light beams to interfere with each other so as to form a first interference light beam, said interference optical system causing a third light beam having the first wavelength and a fourth light beam having the second wavelength to be diffracted by the second diffraction grating so as to generate two diffracted light beams and causing these two diffracted light beams to interfere with each other so as to form a second interference light beam, said interference optical system separating the first and second interference light beams from each other on the basis of the difference in the directions in which they travel from the corresponding diffraction gratings;

a first detector for detecting the first interference light beam to generate a first detection signal;

a second detector for detecting the second interference light beam to generate a second detection signal; and a signal processing section for detecting the phase difference between the first and second detection signals, and for determining the relative displacement between the first and second diffraction gratings on the basis of the phase difference, wherein the first and second diffraction gratings comprise groups of linear gratings each arranged at equal intervals, wherein said interference optical system causes the first and second light beams to impinge upon the first diffraction grating, respectively, from directions within a first plane and causes the third and fourth light beams to impinge upon the second diffraction grating, respectively, from directions within a second plane tilted to the first plane, thereby causing the first and second interference light beams to travel in different directions from the first and second diffraction gratings, respectively.

7. A device for detecting the relative displacement between first and second diffraction gratings which are arranged close to each other, said device comprising:

a light source emitting light of two different wavelengths and directions of polarization;

an interference optical system, said interference optical system causing the light beams emitted by said light source to split into first, second, third, and fourth light beams, the first and third light beams having a first wavelength and first and second directions of polarization, respectively, to impinge upon the first and second diffraction gratings, respectively, from a first direction and causing the second and fourth light beams having a second wavelength different from the first wavelength and the first and second directions of polarization, respectively, to impinge upon the first and second diffraction gratings, respectively, from a second direction different from the first direction, and said interference optical system causing the first and second light beams to be diffracted by the first diffraction grating so as to generate two diffracted light beams and causing these two diffracted light beams to interfere with each other so as to form a first interference light beam of the first direction of polarization, said interference optical system causing the third and fourth light beams to be diffracted by the second diffraction grating so as to generate two diffracted light beams and causing these two diffracted light beams to interfere with each other so as to form a second interference light beam of the second direction of polarization, said interference optical system separating the first and second interference light beams from each other on the basis of the difference in their directions of polarization;

a first detector for detecting the first interference light beam to generate a first detection signal;

a second detector for detecting the second interference light beam to generate a second detection signal; and a signal processing section for detecting the phase difference between the first and second detection signals, and for determining the relative displacement between the first and second diffraction gratings on the basis of the phase difference, wherein the first and second diffraction gratings comprise groups of linear gratings each arranged at equal intervals, wherein said interference optical system comprises polarizing means for making the direction of polarization of the first and second light beams different from the direction of polarization of the third and fourth light beams, and a polarization beam splitter for separating the first and second interference light beams.

8. A method of detecting the relative displacement between first and second diffraction gratings which are arranged close to each other, said method comprising:

an interference step comprising the steps of:

diffracting a first light beam having a first wavelength and a second light beam having a second wavelength different from the first wavelength by the first diffraction grating so as to generate two diffracted light beams, causing these two diffracted light beams to interfere with each other so as to form a first interference light beam, diffracting a third light beam having the first wavelength and a fourth light beam having the second wavelength by the second diffraction grating so as to generate two diffracted light beams, causing these two diffracted light beams to interfere with each other so as to form a second interference light beam;

a separation step in which the first and second interference light beams are separated from each other by the difference in the directions in which they travel from the corresponding diffraction gratings;

a light detection step comprising the step of detecting the first interference light beam and generating a first detection signal in response to detecting the first interference light beam and detecting the second interference light beam and generating a second detection signal in response to detecting the second interference light beam; and a phase difference detection step comprising the step of detecting the phase difference between the first and second detection signals, and determining the relative displacement between the first and second diffraction gratings on the basis of the detected phase difference, and the step of forming the first and second diffraction gratings of groups of linear gratings at equal intervals, and wherein said separation step comprises the steps of causing the first and second light beams to impinge upon the first diffraction grating, respectively, from directions within a first plane and causing the third and fourth light beams to impinge upon the second diffraction grating, respectively, from directions within a second plane tilted to the first plane, thereby causing the first and second interference light beams to travel in different directions from the first and second diffraction gratings, respectively.

9. A method of detecting the relative displacement between first and second diffraction gratings which are arranged close to each other, said method comprising:

an emitting step of emitting light of two different wavelengths and directions of polarization;

an interference step comprising the steps of:

splitting the light emitted in said emitting step into first, second, third, and fourth light beams, the first light beam having a first wavelength and a first direction of polarization, the second light beam having a second wavelength different from the first wavelength and the first direction of polarization, the third light beam having the first wavelength and a second direction of polarization different from the first direction of polarization, the fourth light beam having the second wavelength and the second direction of polarization;

causing the first and the third light beams to impinge upon the first and second diffraction gratings, respectively, from a first direction;

causing the second and the fourth light beams to impinge upon the first and second diffraction gratings, respectively, from a second direction different from the first direction;

diffracting the first and second light beams by the first diffraction grating so as to generate two diffracted light beams;

causing these two diffracted light beams to interfere with each other so as to form a first interference light beam of the first direction of polarization;

diffracting the third and fourth light beams to be diffracted by the second diffraction grating so as to generate two diffracted light beams;

causing these two diffracted light beams to interfere with each other so as to form a second interference light beam of the second direction of polarization;

a separation step in which the first and second interference light beams are separated from each other by the difference in their directions of polarization;

a light detection step comprising the step of detecting the first interference light beam and generating a first detection signal in response to detecting the first interference light beam, and detecting the second interference light beam and generating a second detection signal in response to detecting the second interference light beam; and a phase difference detection step comprising the step of detecting the phase difference between the first and second detection signals, and determining the relative displacement between the first and second diffraction gratings on the basis of the phase difference, and the step of forming the first and second diffraction gratings of groups of linear gratings at equal intervals, and wherein said separation step comprises the steps of using polarizing means for making the direction of polarization of the first and second light beams different from the direction of polarization of the third and fourth light beams, and using a polarization beam splitter for separating the first and second interference light beams from each other.

* * * * *

UNITED STATES PATENT AND TRADEMARK OFFICE
CERTIFICATE OF CORRECTION

PATENT NO. : 5,610,718          Page 1 of 4
DATED      : March 11, 1997
INVENTOR(S): KOICHI SENTOKU, ET AL.

It is certified that error appears in the above-identified patent and that said Letters Patent is hereby corrected as shown below:

COLUMN 5

Line 5, "form" should read --from--.

COLUMN 7

Line 38, "difference" should read --difference in--.

COLUMN 10

Line 5, "$I_M = A^2_M + B^2_M + 2A_M \cdot B_M \cdot \cos\{(\omega_2-\omega_1)t + (\omega_2-\phi_1) + 2\phi_M\}$" should read --$I_M = A^2_M + B^2_M + 2A_M \cdot B_M \cdot \cos\{(\omega_2-\omega_1)t + (\phi_2-\phi_1) + 2\phi_M\}$--.

Line 11, "$I_W = A^2_W + B^2_W + 2A_W B_W \cdot \cos\{(\omega_2-\omega_1)t + (\omega_2-\omega_1) + 2\omega_W\}$" should read --$I_W = A^2_W + B^2_W + 2A_W B_W \cdot \cos\{(\omega_2-\omega_1)t + (\phi_2-\phi_1) + 2\phi_W\}$--.

Line 24, "$\Delta\omega$" should read --$\Delta\phi$--.

Line 26, "$\Delta\omega = \omega_M - \omega_W = 4\pi(X_M-X_W)/P$" should read --$\Delta\phi = \phi_M - \phi_W = 4\pi(X_M-X_W)/P$--.

Line 28, "$\Delta\omega$" should read --$\Delta\phi$--.

Line 55, "X" should read --$\lambda$--.

UNITED STATES PATENT AND TRADEMARK OFFICE
CERTIFICATE OF CORRECTION

PATENT NO. : 5,610,718

DATED : March 11, 1997

INVENTOR(S) : KOICHI SENTOKU, ET AL.

It is certified that error appears in the above-identified patent and that said Letters Patent is hereby corrected as shown below:

COLUMN 13

Line 18, "Wallaston" should read --Wollaston--.

Line 20, "Wallaston" should read --Wollaston--.

Line 21, "Wallaston" should read --Wollaston--.

Line 30, "Wallaston" should read --Wollaston--.

Line 32, "Wallaston" should read --Wollaston--.

Line 33, "Wallaston" should read --Wollaston--.

Line 45, "Wallaston" should read --Wollaston--.

Line 47, "Wallaston" should read --Wollaston--.

Column 14, Line 65, "Wallaston" should read --Wollaston--.

COLUMN 15

Line 1, "Wallaston" should read --Wollaston--.

Line 2, "Wallaston" should read --Wollaston--.

UNITED STATES PATENT AND TRADEMARK OFFICE
CERTIFICATE OF CORRECTION

PATENT NO. : 5,610,718

DATED : March 11, 1997

INVENTOR(S) : KOICHI SENTOKU, ET AL.

It is certified that error appears in the above-indentified patent and that said Letters Patent is hereby corrected as shown below:

COLUMN 15

Line 9, "Wallaston" should read --Wollaston--.

Line 11, "Wallaston" should read --Wollaston--.

Line 12, "Wallaston" should read --Wollaston--.

Line 24, "Wallaston" should read --Wollaston--.

COLUMN 17

Line 36, "X," should read --$\lambda$,--

Line 63, "(1)," (second occurrence) should read --(-1)--.

UNITED STATES PATENT AND TRADEMARK OFFICE
CERTIFICATE OF CORRECTION

PATENT NO. : 5,610,718

DATED : March 11, 1997

INVENTOR(S) : KOICHI SENTOKU, ET AL.

It is certified that error appears in the above-indentified patent and that said Letters Patent is hereby corrected as shown below:

<u>COLUMN 18</u>

Line 55, "+1st" should read --±1st--.

<u>COLUMN 20</u>

Line 18, "12" should read --I 2--.

Signed and Sealed this

Seventh Day of October, 1997

*Attest:*

BRUCE LEHMAN

*Attesting Officer*     Commissioner of Patents and Trademarks